(12) United States Patent
Kamijima et al.

(10) Patent No.: US 8,470,189 B2
(45) Date of Patent: Jun. 25, 2013

(54) METHOD OF FORMING MASK PATTERN, METHOD OF FORMING THIN FILM PATTERN AND METHOD OF FORMING MAGNETORESISTIVE ELEMENT

(75) Inventors: Akifumi Kamijima, Tokyo (JP); Hideyuki Yatsu, Tokyo (JP); Hitoshi Hatate, Tokyo (JP)

(73) Assignee: TDK Corporation, Tokyo (JP)

( * ) Notice: Subject to any disclaimer, the term of this patent is extended or adjusted under 35 U.S.C. 154(b) by 1115 days.

(21) Appl. No.: 12/155,381

(22) Filed: Jun. 3, 2008

(65) Prior Publication Data

US 2009/0294403 A1 Dec. 3, 2009

(51) Int. Cl.
*B44C 1/22* (2006.01)

(52) U.S. Cl.
USPC .......... 216/40; 216/22; 216/37; 216/41; 216/46; 216/47; 216/49; 216/58; 216/74

(58) Field of Classification Search
USPC ............ 216/22, 39, 40, 41, 58, 37, 46, 47, 216/49, 74
See application file for complete search history.

(56) References Cited

U.S. PATENT DOCUMENTS

| | | | | |
|---|---|---|---|---|
| 5,688,410 A * | 11/1997 | Kajitani et al. | | 216/64 |
| 5,843,521 A * | 12/1998 | Ju et al. | | 428/336 |
| 5,875,542 A * | 3/1999 | Tran et al. | | 29/603.14 |
| 6,265,129 B1 * | 7/2001 | Takahashi et al. | | 430/192 |
| 6,391,216 B1 * | 5/2002 | Nakatani | | 216/41 |
| 6,821,451 B2 * | 11/2004 | Hattori | | 216/41 |
| 7,181,827 B2 * | 2/2007 | Kamijima | | 29/603.07 |
| 7,244,368 B2 * | 7/2007 | Suda et al. | | 216/22 |
| 7,475,470 B2 * | 1/2009 | Mochizuki et al. | | 29/603.15 |
| 7,944,651 B2 * | 5/2011 | Ousugi et al. | | 360/324.1 |
| 2002/0001937 A1 * | 1/2002 | Kikuchi et al. | | 438/618 |
| 2006/0132972 A1 * | 6/2006 | Tagami et al. | | 360/126 |
| 2008/0073322 A1 * | 3/2008 | Nozaki et al. | | 216/49 |
| 2009/0068594 A1 * | 3/2009 | Shimbori | | 430/286.1 |

FOREIGN PATENT DOCUMENTS

| | | |
|---|---|---|
| JP | A-5-152294 | 6/1993 |
| JP | A-10-116402 | 5/1998 |
| JP | A-2003-131386 | 5/2003 |
| JP | A-2006-260653 | 9/2006 |
| JP | A-2006-302486 | 11/2006 |
| JP | A-2007-184020 | 7/2007 |

* cited by examiner

*Primary Examiner* — Nadine Norton
*Assistant Examiner* — Christopher Remavege
(74) *Attorney, Agent, or Firm* — Oliff & Berridge, PLC

(57) ABSTRACT

In the present invention, provided is a method of forming a mask pattern by which a fine thin film pattern may be formed more easily with higher resolution and precision. In the method of forming a mask pattern, a photoresist pattern having an opening is formed on a substrate, then, an inorganic film is formed so as to cover the upper surface of the photoresist pattern and the inside of the opening, then the inorganic film on the upper surface of the photoresist pattern is removed by a dry etching process. Subsequently, an inorganic mask pattern is formed by removing the photoresist pattern. The inorganic mask pattern thus formed hardly produces an issue of deformation such as physical displacement even when it is heated in the dry etching process.

19 Claims, 30 Drawing Sheets

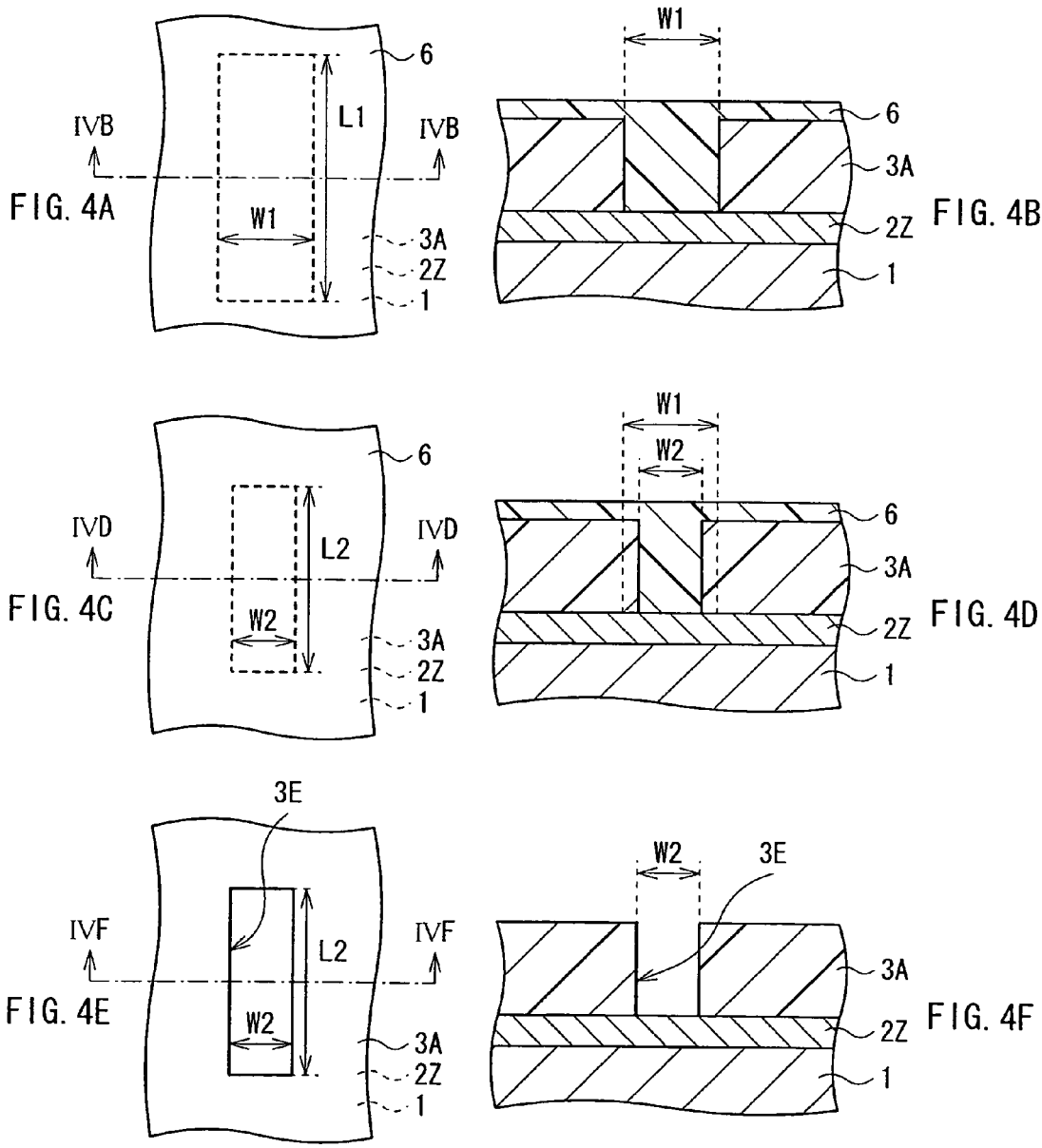

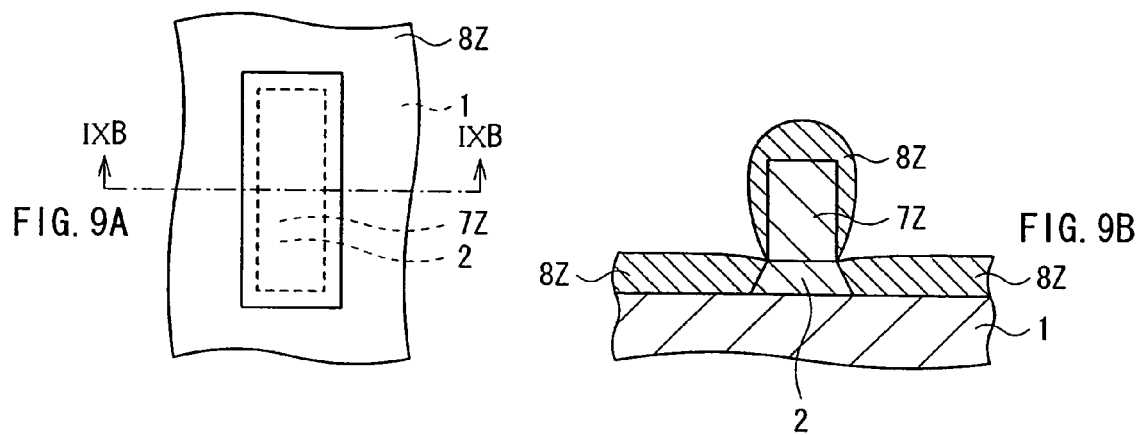
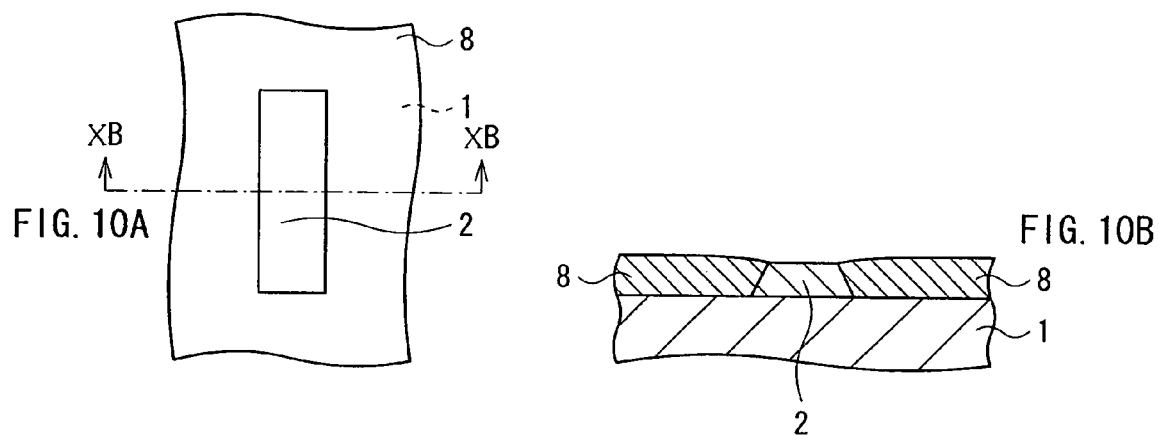

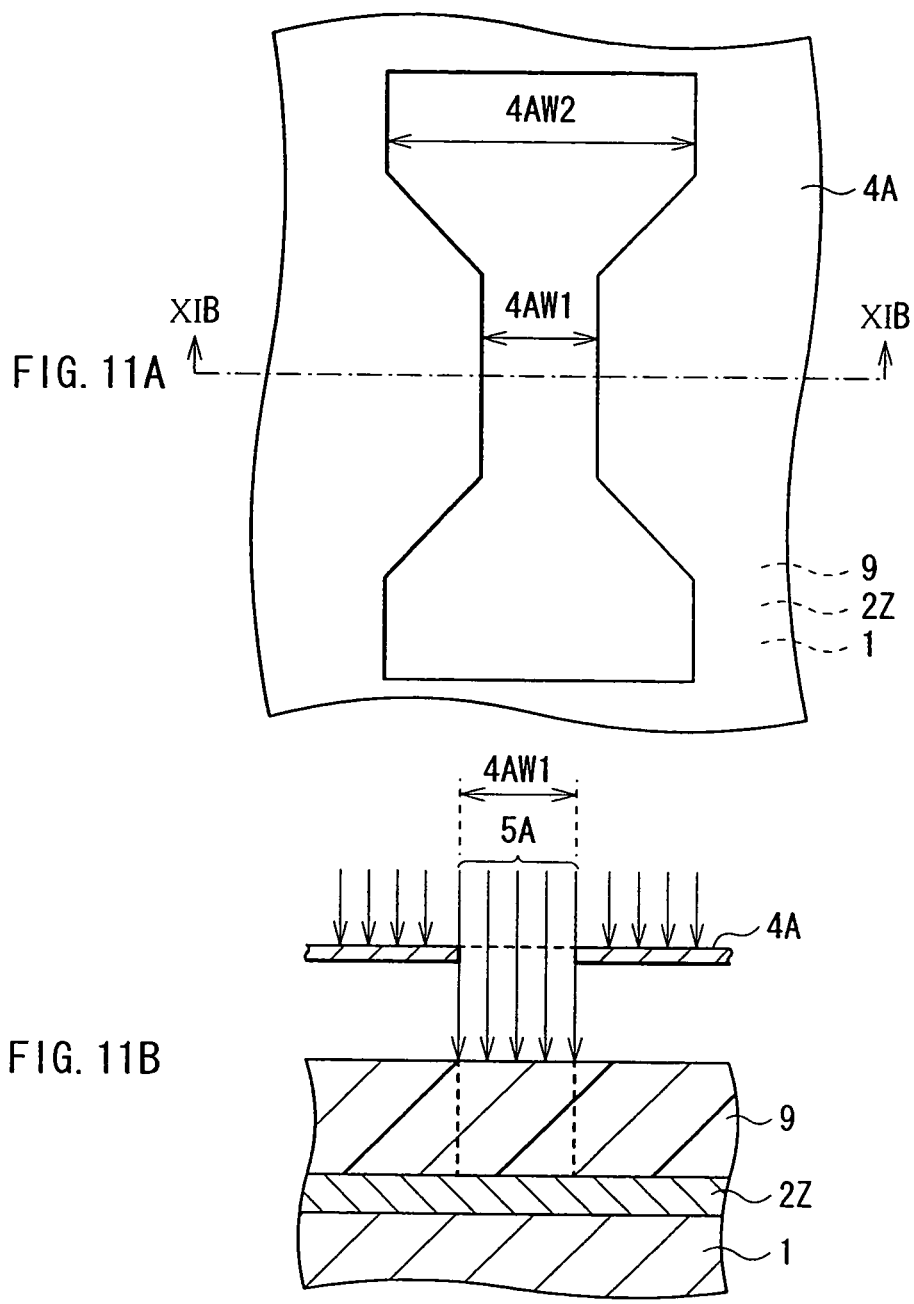

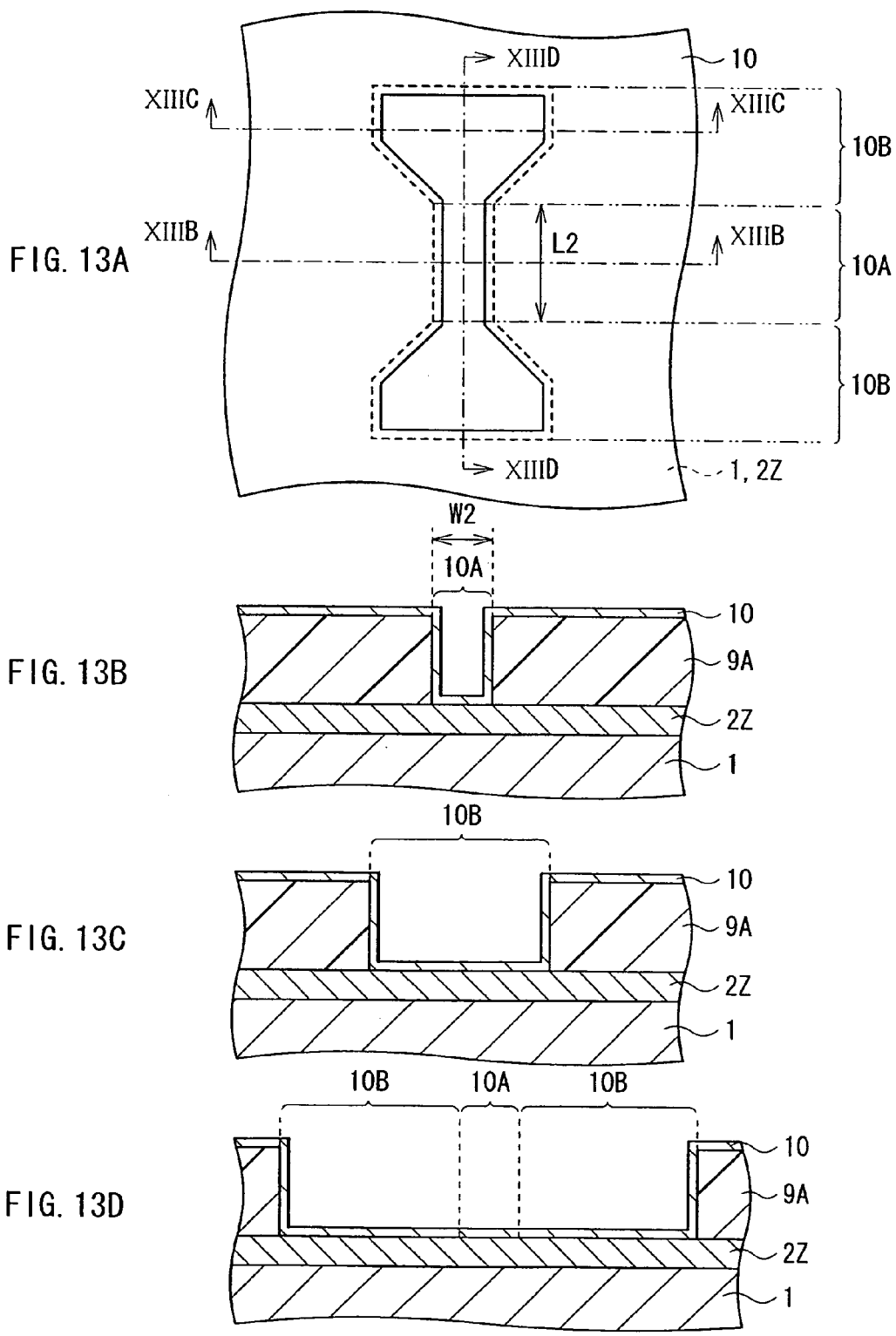

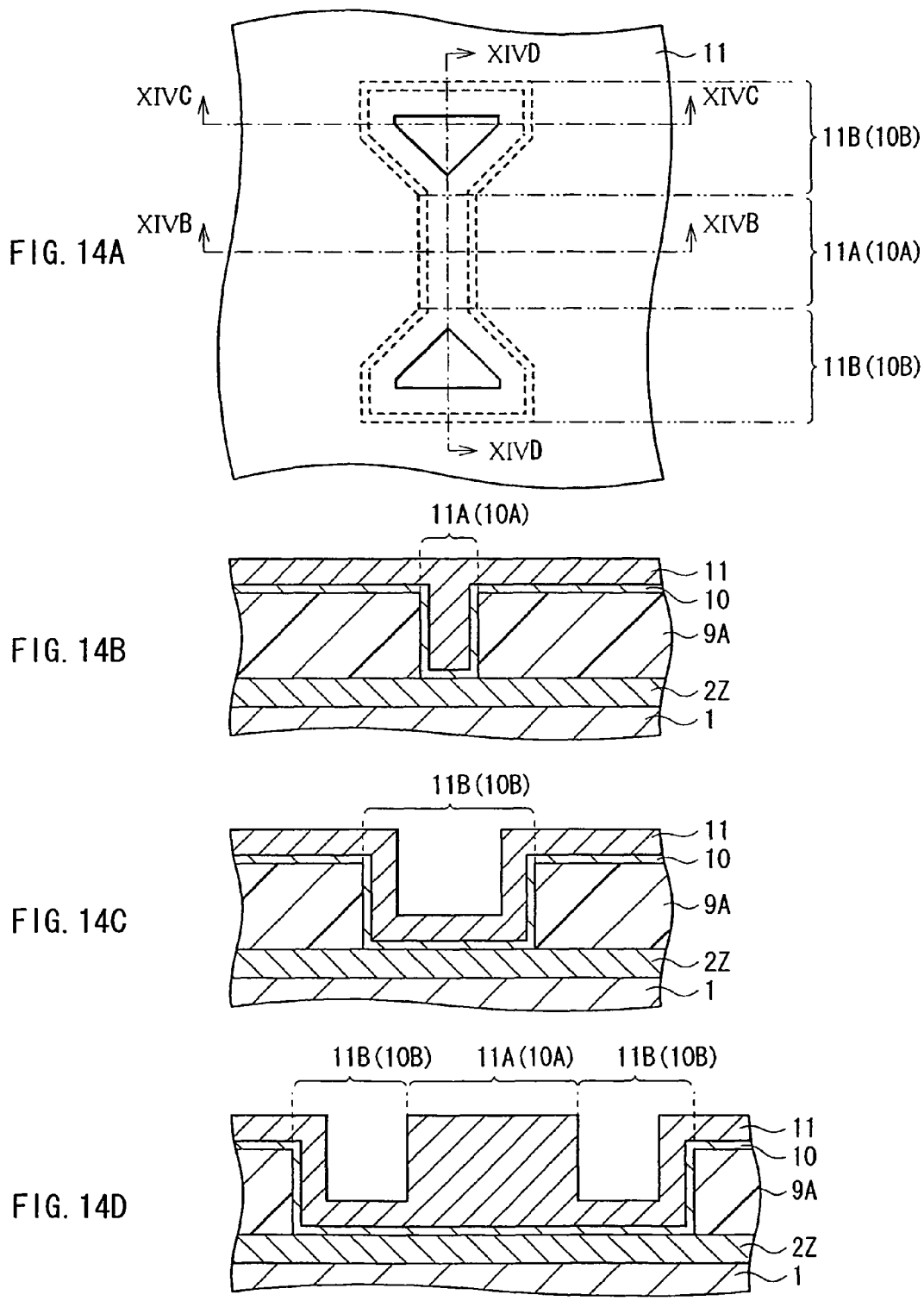

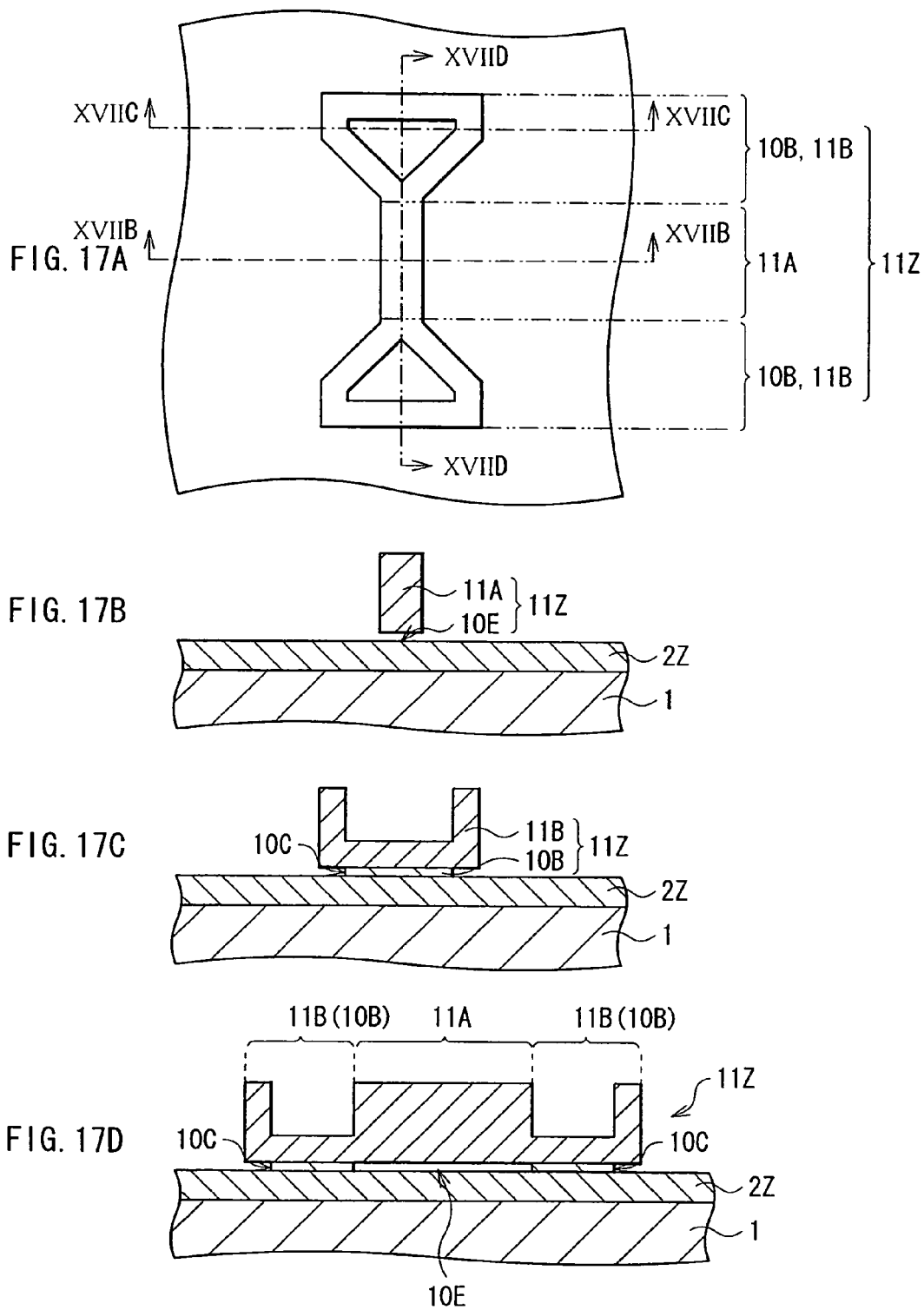

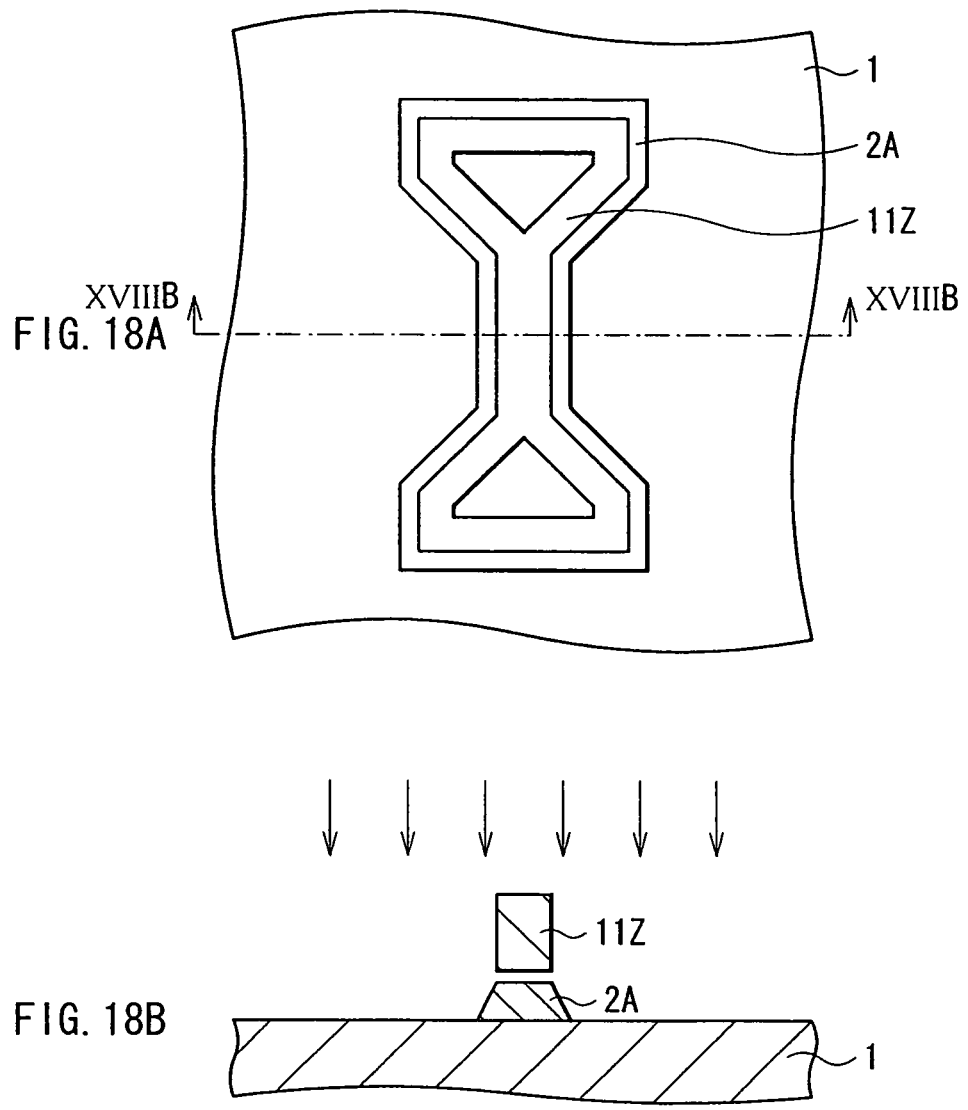

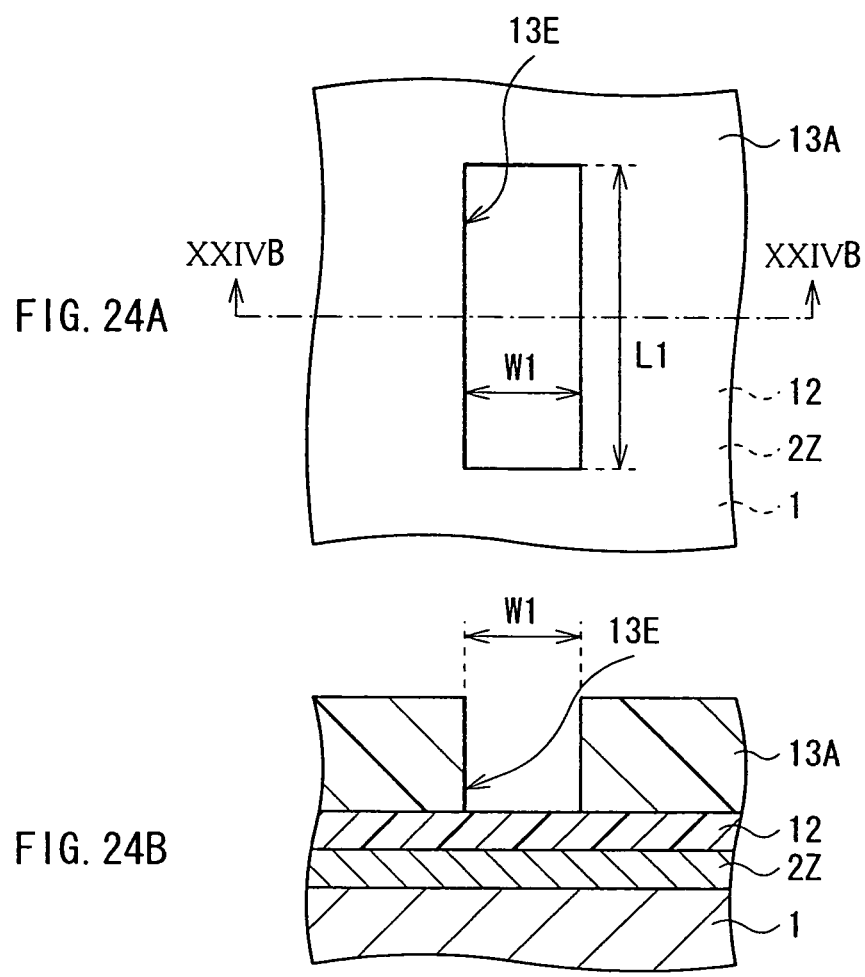

METHOD OF FORMING MASK PATTERN, METHOD OF FORMING THIN FILM PATTERN AND METHOD OF FORMING MAGNETORESISTIVE ELEMENT

BACKGROUND OF THE INVENTION

1. Field of the Invention

The present invention relates to a method of forming a mask pattern suitable for forming a fine thin film pattern, a method of forming a thin film pattern and a method of forming an MR element using the mask pattern.

2. Description of the Related Art

Conventionally, various thin film patterns are used in many ways in the electronic and magnetic devices such as a thin film magnetic head and a semiconductor device formed through a thin-film formation process. Generally, a dry etching process is used to form such thin film patterns, and a mask pattern is necessary in this process. Here, a thin film is formed at first to cover the whole surface of a substrate, then a photoresist pattern with a desired pattern shape is formed on the thin film by photolithography, etc. Subsequently, a dry etching process such as ion milling is applied to the thin film using the photoresist pattern as a mask, thereby a thin film pattern with a desired configuration is formed. Such formation method is employed, for example, in fabrication of a thin film magnetic head including a magnetoresistive (MR) element formed by stacking a magnetic thin film and so on (for example, refer to Japanese Patent Publication No. 2006-260653; Japanese Patent Publication No. 2006-302486; Japanese Patent Publication No. 2006-073088; and Japanese Patent Publication No. 2007-184020), or in fabrication of a wiring pattern of a semiconductor device constituted from a conductive thin film (for example, refer to Japanese Patent Publication No. H05-152294). Thus, to obtain higher formation accuracy in the formation of the thin film pattern including the above-mentioned dry etching process, a mask pattern with high precision is necessary.

However, when a photoresist pattern is employed as a mask pattern as mentioned above, resolution and precision available are limited. It is because the photoresist pattern is easily deformed because it may be shrunk or its corner may be rounded with a thermal influence applied in the dry etching process and physical displacement such as difference in dimensions from its original one is liable to occur. Accordingly, it is difficult to form a fine mask pattern using a photoresist material, and in particular, it is very difficult to form a fine isolated mask pattern. For this reason, it is desirable to use a mask made of an inorganic material.

Meanwhile, methods of forming a magnetic pole of a magnetic write head, which is made of an inorganic material, are proposed (for example, refer to Japanese Patent Publication No. H10-116402 and Japanese Patent Publication No. 2003-131386). Those methods are implemented by what is called a frame plating process.

SUMMARY OF THE INVENTION

However, when the frame plating process is applied to form a mask pattern made of an inorganic material, the process includes steps of forming a seed layer used as an electrode on a thin film to be processed and removing the seed layer after patterning. In this case, it is difficult to remove the unnecessary seed layer without affecting its foundation layer after the mask pattern is completed. In addition, because of remarkably progressing miniaturization of electronic and magnetic devices these days, demand for finer processing technology of a thin film pattern is increasing. For this reason, a method of forming a mask pattern (in particular, isolated mask pattern containing an inorganic material) with high resolution and precision is expected.

The present invention has been devised in view of the above issues, and it is desirable to provide a method of forming a mask pattern, a method of forming a thin film pattern, and a method of forming a magnetoresistive element, by which a fine thin film pattern can be formed more easily with higher resolution and precision.

A method of forming a mask pattern according to an embodiment of the present invention includes steps of forming, on a substrate, a photoresist pattern having an opening, forming an inorganic film by a dry process so as to cover upper surface of the photoresist pattern and inside of the opening, removing the inorganic film on the upper surface of the photoresist pattern by a dry etching process, and removing the photoresist pattern, and thereby forming an inorganic mask pattern corresponding to the opening. It is to be noted that the "dry process" includes a CVD (Chemical Vapor Deposition) process and a PVD (Physical Vapor Deposition) process such as a sputtering process or evaporation method, for example. The "corresponding to the opening" means having the same configuration as an inner shape of the opening. Further, the "dry etching process" includes an ion milling process and a reactive ion etching (RIE) process, for example.

A method of forming a first thin film pattern according to an embodiment of the present invention includes steps of forming, on a first thin film to be processed, a photoresist pattern having an opening, forming an inorganic film so as to cover upper surface of the photoresist pattern and inside of the opening by a dry process, removing the inorganic film on the upper surface of the photoresist pattern by a dry etching process, removing the photoresist pattern, thereby forming an inorganic mask pattern corresponding to the opening, and forming a first thin film pattern through patterning the thin film to be processed by selectively removing the first thin film to be processed using the inorganic mask pattern.

A method of forming a second thin film pattern according to an embodiment of the present invention includes steps of forming, on a substrate, a photoresist pattern having an opening, forming an inorganic film by a dry process so as to cover upper surface of the photoresist pattern and inside of the opening, removing the inorganic film on the upper surface of the photoresist pattern by a dry etching process, removing the photoresist pattern, thereby forming an inorganic mask pattern corresponding to the opening, forming a thin film so as to cover the inorganic mask pattern and an exposed region where the photoresist pattern is removed, and lifting off the inorganic mask pattern covered with the thin film.

A method of forming a magnetoresistive element according to an embodiment of the present invention includes steps of forming a photoresist pattern having an opening on a magnetoresistive film, forming an inorganic film by a dry process so as to cover upper surface of the photoresist pattern and inside of the opening, removing the inorganic film on the upper surface of the photoresist pattern by a dry etching process, removing the photoresist pattern, thereby forming an inorganic mask pattern corresponding to the opening, and selectively removing the magnetoresistive film using the inorganic mask pattern, thereby forming a magnetoresistive film pattern.

In the method of forming a mask pattern according to an embodiment of the present invention, the inorganic film is formed so as to cover the upper surface of the photoresist pattern and the inside of the opening by a dry process, and the inorganic film on the upper surface of the photoresist pattern is removed by a dry etching process, then the photoresist pattern is removed, thereby the inorganic mask pattern corresponding to the opening has been obtained. In this manner, a mask pattern which is hardly deformed with high structural stability is available as compared with a mask pattern formed with a photoresist material, for example. In addition, steps of forming a seed layer and removing the seed layer are unnecessary, as compared with a mask pattern made of an inorganic material which is formed by frame plating process, for example. Accordingly, in the method of forming the first and second thin film patterns and the method of forming the MR element by use of the mask pattern according to an embodiment of the present invention, a fine thin film pattern can be formed more easily with higher resolution and precision.

In the method of forming a mask pattern according to an embodiment of the present invention, the photoresist pattern may be formed so that the opening may include a groove-shaped opening and a pair of other openings connected to both ends of the groove-shaped opening, respectively, the inorganic film may be formed by stacking a first inorganic layer and a second inorganic layer in order, and at least both ends, in the width direction, of a portion of the first inorganic layer included in the inorganic mask pattern may be dissolved and removed, the portion having a shape corresponding to the groove-shaped opening. In this case, it is preferred that, the portion of the first inorganic layer corresponding to the groove-shaped opening is entirely dissolved and removed. In this manner, since the mask pattern having a bridge construction is formed, when such a method of forming a mask pattern is used in forming a thin film pattern and a magnetoresistive element, the thin film can be patterned with higher resolution and precision, and the liftoff process becomes easier.

In the method of forming a mask pattern according to an embodiment of the present invention, an undercut structure may be formed in such a manner that the substrate is formed so as to include a soluble layer as its uppermost layer, and the photoresist pattern is formed on the soluble layer, and then an outer edge of the soluble layer just beneath the inorganic mask pattern is partially dissolved and removed so that an undercut structure is formed. Here, the "soluble layer" means a layer made of a material that can dissolve more easily than the inorganic mask pattern in a solvent used when dissolving and removing a part of the mask pattern. The soluble layer may be made of an inorganic material or may be made of an organic material. When such a method of forming a mask pattern is used in forming a thin film pattern and a magnetoresistive element, the thin film can be patterned with higher resolution and precision, and liftoff process becomes easier. Other objects, features and effects of embodiments of the present invention will become clearer in the following descriptions.

BRIEF DESCRIPTION OF THE DRAWINGS

FIGS. 4A, 4B, 4C, 4D, 4E and 4F are plan views and sectional views of steps subsequent to FIGS. 3A and 3B.

FIGS. 9A and 9B are a plan view and a sectional view of a step subsequent to FIGS. 8A and 8B.

FIGS. 10A and 10B are a plan view and a sectional view of a step subsequent to FIGS. 9A and 9B.

FIGS. 11A and 11B are a plan view and a sectional view of a step in the method of forming a thin film pattern according to a second embodiment of the present invention.

FIGS. 13A, 13B, 13C and 13D are a plan view and sectional views of a step subsequent to FIGS. 12A and 12B.

FIGS. 14A, 14B, 14C and 14D are a plan view and sectional views of a step subsequent to FIGS. 13A through 13D.

FIGS. 17A, 17B, 17C and 17D are a plan view and sectional views of a step subsequent to FIGS. 16A through 16D.

FIGS. 18A and 18B are a plan view and a sectional view of a step subsequent to FIGS. 17A through 17D.

FIGS. 24A and 24B are a plan view and a sectional view of a step subsequent to FIG. 23.

DESCRIPTION OF THE PREFERRED EMBODIMENTS

An embodiment of the invention will be described in detail hereinbelow with reference to the drawings.

[First Embodiment]

First, a method of forming a thin film pattern according to a first embodiment of the present invention will be described with reference to FIGS. 1 to 10. Here, a method of forming a mask pattern of the present invention will also be described together since it can be realized by the method of forming a thin film pattern, in which the mask pattern is used. The same is true for all the other embodiments.

The method of forming a thin film pattern of the present embodiment includes a step of forming a mask pattern, a first-half step of patterning to form a thin film pattern (a first thin film pattern), and a latter-half step of patterning to form another thin film pattern (second thin film pattern) disposed on both sides of the first thin film pattern, with the first thin film pattern in between. The step of forming a mask pattern includes steps of forming a photoresist pattern having an opening therein on a thin film to become the first thin film pattern, which is provided on a substrate, forming an inorganic film so as to cover the upper surface of the photoresist pattern and the inside of the opening using dry process, removing the inorganic film formed on the upper surface of the photoresist pattern by a dry etching process, and forming an inorganic mask pattern configured corresponding to the opening by removing the photoresist pattern. The first-half step of patterning includes a step of forming the first thin film pattern by selectively removing the thin film using the inorganic mask pattern. The latter-half step of patterning includes steps of forming the other thin film to become the second thin film pattern so as to cover the inorganic mask pattern and an area on which the first thin film pattern is removed, and forming the second thin film pattern so as to surround the first thin film pattern by lifting off the inorganic mask pattern covered with the other thin film. Details will be described hereinbelow.

Figure 1:
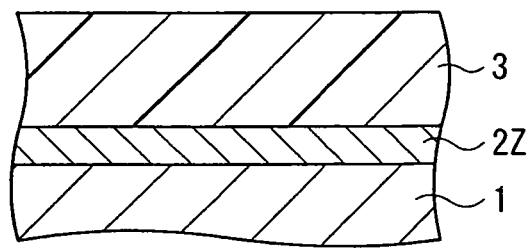
FIG. 1 is a sectional view of a step in the method of forming a thin film pattern according to a first embodiment of the present invention.

First, as shown in FIG. 1, a thin film 2Z, which is typically made of tantalum (Ta) as a component material, is formed by a sputtering process as a preliminary stage of an after-mentioned thin film pattern 2 (the first thin film pattern) to cover the whole surface of a substrate 1, which is formed by stacking a specified function film as necessary on a base made of altic ($Al_2O_3$.Tic) or the like.

Next, the process proceeds to a step of forming a mask pattern. First, a photoresist layer 3 is formed so as to cover the thin film 2Z by a spin coat method. Here, using typically a positive-photoresist material containing polyhydroxy styrene (PHS) as its main ingredient, the photoresist layer 3 is formed to a thickness of 100 nm to 400 nm for example.

Figure 2A:
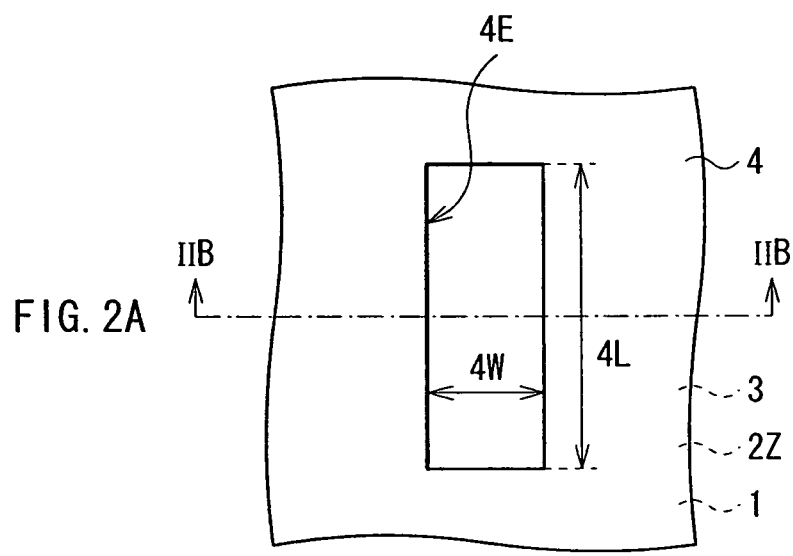
FIGS. 2A and 2B are a plan view and a sectional view of a step subsequent to FIG. 1.
Figure 2B:
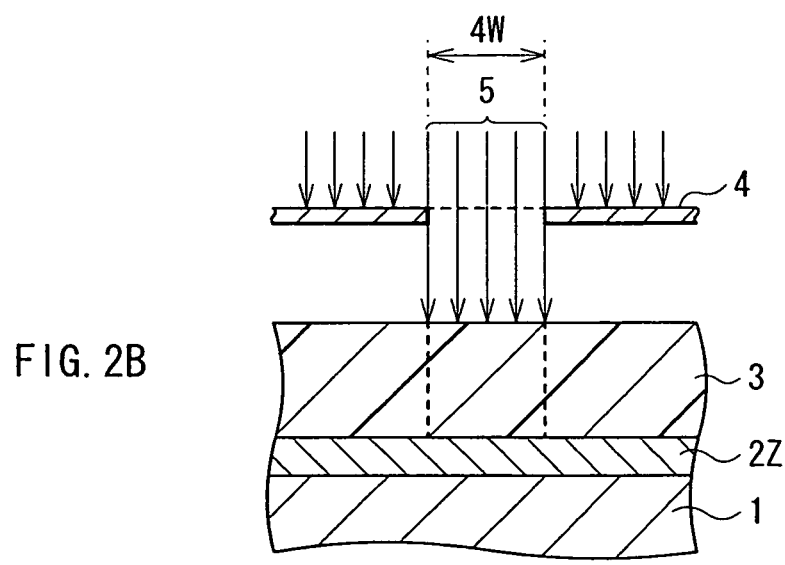
Figure 3A:
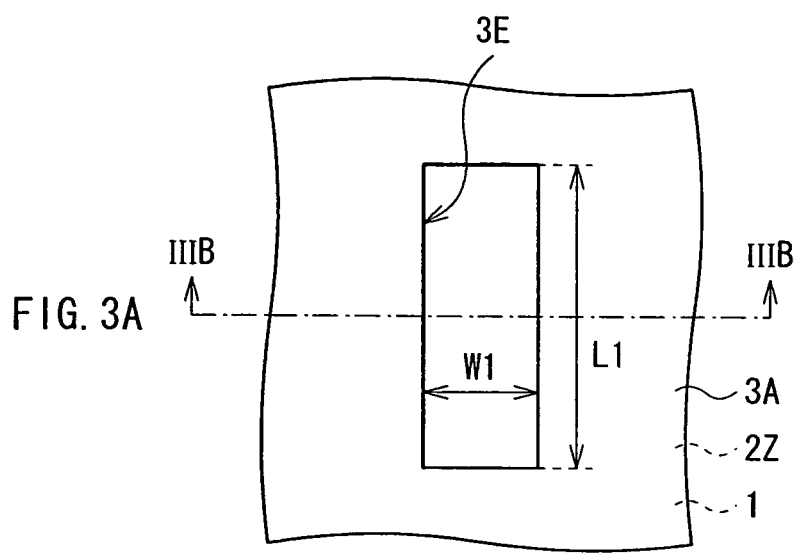
FIGS. 3A and 3B are a plan view and a sectional view of a step subsequent to FIGS. 2A and 2B.
Figure 3B:
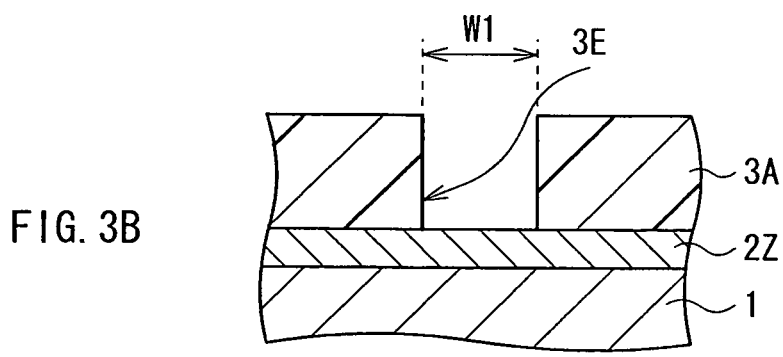

Subsequently, as shown in FIG. 3, the photoresist pattern 3A which has an opening 3E is formed on the thin film 2Z by photolithographic process applied to the photoresist layer 3. More specifically, a latent image portion 5 is formed by selectively exposing the photoresist layer 3 as shown in FIG. 2B via a photo mask 4 as shown in FIG. 2A. Here, to form the opening 3E, the photo mask 4 has a rectangular opening 4E with the width 4W and the length 4L. The width 4W is typically 0.05 to 0.40 μm (more preferably, 0.18 to 0.24 μm). The length 4L is longer than the width 4W. However, when using a reduced projection exposure apparatus, such as a stepper, the above-mentioned dimensions shall be multiplied by 1/reduction-ratio. Subsequently, the photoresist layer 3 is heated in an atmosphere at 120° C. for 90 seconds, after selectively producing a latent image therein, then it is developed by dissolving and removing the exposed portion using a specified developer, and washed and dried. In this manner, the photoresist pattern 3A, which has a groove-shaped opening 3E with the width W1 and the length L1, is formed as shown in FIG. 3. FIG. 3A shows a plan configuration of the photoresist pattern 3A, and FIG. 3B shows a cross-sectional configuration taken along the line IIIB-IIIB of FIG. 3A. Here, the groove-shaped configuration is configured in such a manner that the width is smaller than the length as viewed in the plan view as shown in FIG. 3A, including a depression as viewed in the cross-sectional configuration as shown in FIG. 3B. Namely, the width W1 is smaller than the length L1 here. To ease the liftoff process of an after-mentioned inorganic mask pattern 7Z, it is preferred that the photoresist pattern 3A is formed so that one end of the opening 3E near the exposed portion of the thin film 2Z may be narrower than the other end thereof (on the upper end of the photoresist pattern 3A) (that is, spread upwards).

Subsequently, the inside dimension of the opening 3E may be narrowed as necessary. In this manner, the dimension (width and length) of the after-mentioned inorganic mask pattern 7Z is adjustable, thereby a thin film can be patterned with higher resolution and higher precision as compared with the case where the narrowing process is not given. The narrowing process is implemented by making the photoresist pattern 3A shrink through thermal-flow aided process using a water-soluble resin, for example. More detailed process is shown in FIG. 4. FIGS. 4A, 4C and 4E show plan configurations showing each step of narrowing the inside dimension. FIG. 4B shows a cross-sectional configuration taken along the line IVB-IVB of FIG. 4A, FIG. 4D shows a cross-sectional configuration taken along the line IVD-IVD of FIG. 4C, and FIG. 4F shows a cross-sectional configuration taken along the line IVF-IVF of FIG. 4E. First, as shown in FIGS. 4A and 4B, a water-soluble resin layer 6 is formed by, for example, a spin coat method so as to cover the photoresist pattern 3A. Examples of the water-soluble resin available may include Safire resin FSC (TOKYO OHKA KOGYO CO., LTD.) and RELACS resin (AZ Electronic Materials K.K.) and so on. Subsequently, the water-soluble resin layer 6 and the photoresist pattern 3A are heated for 180 seconds in 130° C. atmosphere, for example. In this manner, the width W1 and the length L1 of the opening 3E are decreased as shown in FIGS. 4C and 4D. As a result, the inside dimension of the opening 3E narrows compared with the width W1 and the length L1, to a width W2, and a length L2. In addition, there is another advantage that the configuration of the opening 3E is refined through the process. Then, the water-soluble resin layer 6 is washed away and dried as shown in FIGS. 4E and 4F. By repeating a series of the above-mentioned step of narrowing the inside dimension as shown in FIG. 4 over and over, it is possible to further decrease the inside dimension. Namely, it is possible to obtain a finer and more precise mask pattern when the above-mentioned process as shown in FIG. 4 is applied to the photoresist pattern 3A, than the case without applying the process.

Subsequently, an inorganic film 7 is formed by a dry processes such as CVD (Chemical Vapor Deposition) so that the upper surface of the photoresist pattern 3A and the inside of the opening 3E may be covered as shown in FIG. 5. FIGS. 5A and 5C show plan configurations of the photoresist pattern 3A covered with the inorganic film 7, and FIG. 5B shows a cross-sectional configuration taken along the line VB-VB of FIG. 5A, and FIG. 5D shows a cross-sectional configuration taken along the line VD-VD of FIG. 5C. Here, low-temperature CVD method is preferred as the dry process because it prevents the photoresist pattern 3A from deformation by heating, and also because it allows the material constituting the inorganic film 7 to accumulate isotropically to form a uniform film. The material constituting the inorganic film 7 is arbitrary, and it may be made of only one sort of material, or may be made of two or more sorts of materials. Alternatively, the inorganic film 7 may have a stacked structure including a plurality of layers made of one or more sorts of materials. When the inorganic film 7 has a stacked structure including a plurality of layers, it is preferred that a first layer, which is formed in direct contact with the photoresist pattern 3A, is formed at a low temperature for the above-mentioned reason. However, the other layers above the first layer may be formed by a sputtering process or the like. Examples of a material of the inorganic film 7 include metals such as copper (Cu) and metal oxides such as or alumina (aluminum2O3), which are easy to remove by a wet etching process when removing the inorganic mask pattern 7Z as mentioned later. The inorganic film 7 formed in this manner comes to have a microscopic undercut portion in the inorganic mask pattern 7Z mentioned later by standing waves of the photoresist pattern 3A. More specifically, the photoresist pattern vibrates by the standing waves so that the material constituting the inorganic film 7 does not accumulate on the corner portions between the side wall of the photoresist pattern 3A and the exposed portion of the thin film 2Z within the opening 3E, thereby forming an undercut portion.

Figure 5A:
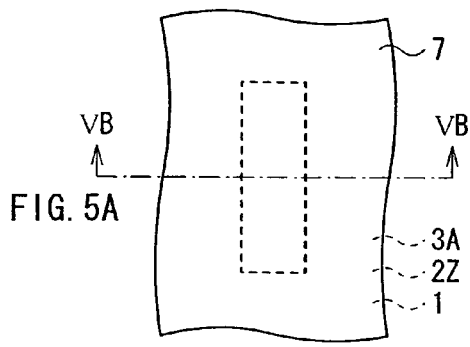
FIGS. 5A, 5B, 5C and 5D are plan views and sectional views of steps subsequent to FIGS. 4A through 4F.
Figure 5B:
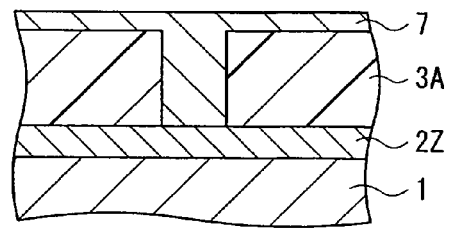
Figure 5C:
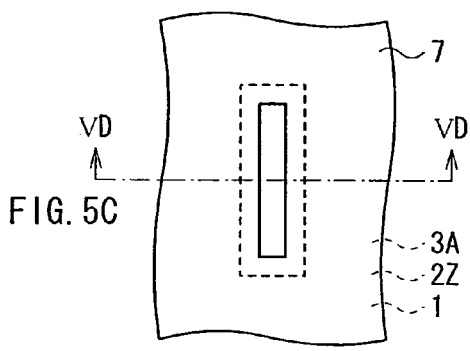
Figure 5D:
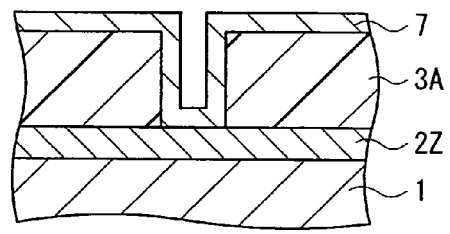
Figure 6A:
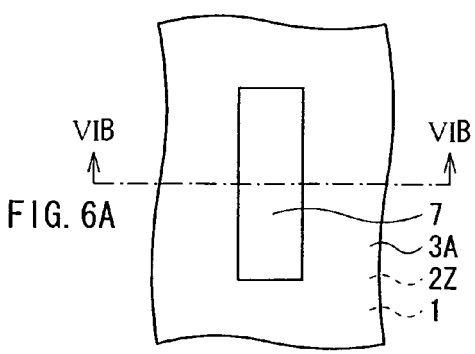
FIGS. 6A and 6B are a plan view and a sectional view of a step subsequent to FIGS. 5A through 5D.
Figure 6B:
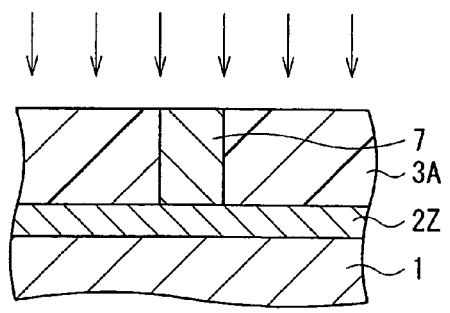

The inorganic film 7 here covers the upper surface of the photoresist pattern 3A, and the exposed portion of the thin film 2Z and the wall surface of the photoresist pattern 3A within the opening 3E. The inorganic film 7 may fill the opening 3E as shown in FIGS. 5A and 5B, or may not thoroughly fill the opening 3E so that the cross-sectional configuration thereof may be a tuning fork in shape or U-shaped. Though the case where the inorganic film 7 is formed to fill the opening 3E (FIGS. 5A and 5B) needs more time and formation materials to form the inorganic film 7 as compared with the case where it does not thoroughly fill the opening 3E (FIGS. 5C and 5D), it is preferable because it allows to increase the structural stability and prevent deformation at the time of dry etching process. However, even when the inorganic film 7 is formed not thoroughly filling the opening 3E, in the case of the after-mentioned inorganic mask pattern 7Z, since its cross-sectional configuration has a symmetrical structure like the tuning-fork shape as viewed in the width direction, it enables to obtain a sufficient structural stability without producing deformation such as inclining or distortion. Hereinbelow, description will be made for the case where the inorganic film 7 is formed to fill the opening 3E as shown in FIGS. 5A and 5B. As a next step, as shown in FIG. 6, the inorganic film 7 formed on the upper surface of the photoresist pattern 3A is removed by a dry etching process such as ion milling and reactive ion etching (RIE), for example. FIG. 6A shows a plan configuration of the photoresist pattern 3A and the inorganic film 7, and FIG. 6B shows a cross-sectional configuration taken along the line VIB-VIB of FIG. 6A. In this case, over-etching is desirable, and it is preferred that the upper surface of the inorganic film 7 provided in the opening 3E is over-etched until the height thereof is adjusted to the same level as that of the upper surface of the photoresist pattern 3A. In this manner, the upper surface corners of the inorganic mask pattern 7Z as mentioned later are sharpened to allow the thin film 2Z to be etched more precisely, thereby the thin film pattern with higher accuracy is available. When the inorganic film 7 is formed not to fill the groove-shaped opening 3E thoroughly as shown in FIGS. 5C and 5D, it is desirable to set up an etching condition not to etch at least the portion, as for the inorganic film 7, in contact with the thin film 2Z (namely, the bottom portion of the inorganic film 7).

Figure 7A:
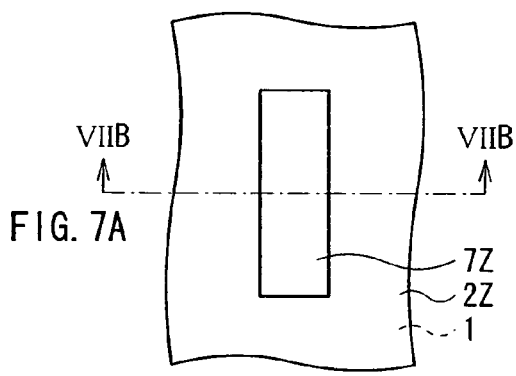
FIGS. 7A and 7B are a plan view and a sectional view of a step subsequent to FIGS. 6A and 6B.
Figure 7B:
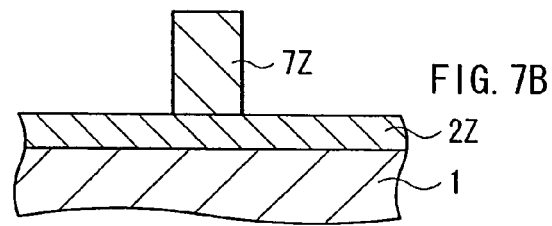

Subsequently, the photoresist pattern 3A is removed as shown in FIG. 7. FIG. 7A shows a plan view of the inorganic mask pattern 7Z, and FIG. 7B shows a cross-sectional configuration taken along the line VIIB-VIIB of FIG. 7A. Specifically, the whole surface of the photoresist pattern 3A is exposed, then dissolved and removed using a specified developer, and then washed and dried. Alternatively, the photoresist pattern 3A may be removed by dissolving using an organic solvent, or by dry development such as ashing. In this manner, the inorganic mask pattern 7Z configured corresponding to the inside shape of the opening 3E has been completed. That is the end of the step of forming a mask pattern.

Figure 8A:
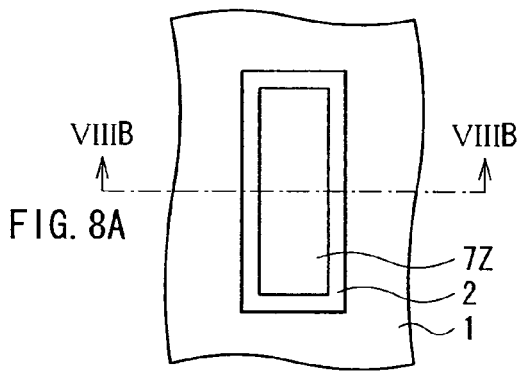
FIGS. 8A and 8B are a plan view and a sectional view of a step subsequent to FIGS. 7A and 7B.
Figure 8B:
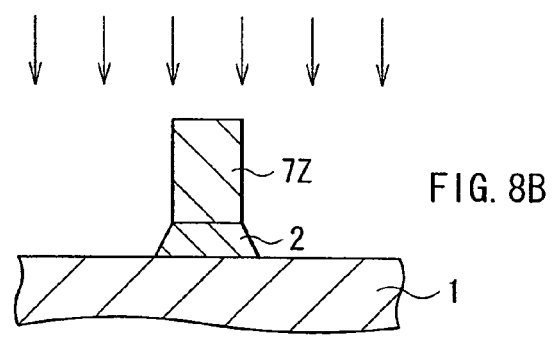

Next, the process goes to the first-half step of patterning. As shown in FIG. 8, the thin film pattern 2 is formed by selectively etching the thin film 2Z by a dry etching process using the inorganic mask pattern 7Z as a mask. FIG. 8A shows a plan configuration showing this process, and FIG. 8B shows a cross-sectional configuration taken along the line VIIIB-VIIIB of FIG. 8A. In this case, since the inorganic mask pattern 7Z is etched together with the thin film 2Z, thickness thereof is decreased. Accordingly, it is desirable to foresee the decrease in thickness and form the inorganic film 7 thick enough in advance to obtain a sufficient intensity. That is the end of the first-half step of patterning.

Next, the process goes to the latter-half step of patterning. First, as shown in FIG. 9, a thin film 8Z, which is a preliminary stage of a thin film pattern 8 (the second thin film pattern), is formed so as to cover the substrate 1 exposed by the foregoing etching process and the inorganic mask pattern 7Z. FIG. 9A shows a plan configuration in the course of the process, and FIG. 9B shows across-sectional configuration taken along the line IXB-IXB of FIG. 9A.

Finally, the inorganic mask pattern 7Z covered with the thin film 8Z is removed by a liftoff process. Specifically, the inorganic mask pattern 7Z is soaked in a specified solvent solution and if necessary, it is shaken or an ultrasonic wave is applied thereto. That is the end of the latter-half step of patterning, thus the thin film pattern 2 and the thin film pattern 8 adjoined with the thin film pattern 2 in between is completed as shown in FIG. 10. Here, all the steps in the method of forming a thin film pattern in the present embodiment are completed.

Since the present embodiment includes the steps of forming the photoresist pattern 3A with the opening 3E provided on the thin film 2Z, forming the inorganic film 7 by a dry process so as to cover the upper surface of the photoresist pattern 3A and the inside of the opening 3E, and forming the inorganic mask pattern 7Z configured corresponding to the inner shape of the opening 3E by removing the inorganic film 7 on the photoresist pattern 3A and removing the photoresist pattern 3A by a dry etching process, even when the inorganic mask pattern 7Z is heated through the dry etching process and so on, it is not easily influenced by thermal decay such as deformation such as physical displacement, etc, thereby increasing the structural stability. Accordingly, in the method of forming a thin film pattern in the present embodiment, since the thin film 2Z is selectively removed using the inorganic mask pattern 7Z, the fine thin film pattern 2 can be formed more easily, with higher resolution and precision. In particular, since the present embodiment includes the step of forming the other thin film pattern 8 adjoined with the thin film pattern 2 in between by forming at first the other thin film 8Z to cover the area where the thin film 2Z has been removed and then by lifting off the inorganic mask pattern 7Z covered with the thin film 8Z, the thin film pattern 8 can be adjoined in contact with the thin film pattern 2 with high precision.

Alternatively, when the inorganic film 7 is formed after performing the step of narrowing the inside dimension of the opening 3E in the photoresist pattern 3A, as shown in FIG. 4 for example, the inorganic mask pattern 7Z is configured corresponding to the inside dimension of the opening 3. As a result, it becomes possible to form finer inorganic mask pattern 7Z with high precision in particular. Therefore, it becomes possible to form the fine thin film pattern 2 with higher resolution and precision in particular. Further, when the inorganic film 7 is formed to fill the opening 3E, that prevents the inorganic mask pattern 7Z from being deformed, thereby obtaining the thin film pattern 2 with higher resolution and precision. In addition, since the inorganic film 7 covering the upper surface of the photoresist pattern 3A is removed by over-etching, the thin film pattern 2 can be formed with higher resolution and precision.

Although the thin film pattern of the present embodiment is formed through the series of flows including the step of forming a mask pattern, the first-half step of patterning and the latter-half step of patterning, it is not limited to this. For example, the step of forming a mask pattern may be followed by the first-half step of patterning and be completed there. It is also possible that the step of forming a mask pattern may be followed by the latter-half step of patterning. In the case of completing the process by the first-half step of patterning, the thin film 2Z is selectively etched by a dry etching process as shown in FIGS. 8A and 8B to form the thin film pattern 2, then the inorganic mask pattern 7Z is removed. The case where the step of forming a mask pattern is followed by the latter-half step of patterning will be explained in the method of forming a thin film pattern according to a fourth embodiment.

Hereinbelow will be described the other embodiments, and component elements similar to those in the first embodiment are denoted by the same reference numerals so that overlapping description is suitably omitted. Similarly, description of steps similar to those in the first embodiment is suitably omitted.

[Second Embodiment]

Hereinbelow will be described the method of forming a thin film pattern as a second embodiment of the present invention with reference to FIGS. 11 to 20.

In the first embodiment, the inorganic film 7 is formed as one unit as shown in FIG. 5 using the photoresist pattern 3A with the groove-shaped opening 3E as shown in FIG. 3. Then, as shown in FIG. 7, the long and slender-shaped inorganic mask pattern 7Z is formed. On the other hand, in the present embodiment, a photoresist pattern is formed to have an opening configured of a groove-shaped opening and a pair of other openings connected to the both ends of the groove-shaped opening, and an inorganic film is formed by stacking a first inorganic layer and a second inorganic layer in order, then the photoresist pattern is removed, thereby obtaining an inorganic mask pattern. After this, a portion of the first inorganic layer included in the inorganic mask pattern, corresponding to the groove-shaped opening, is dissolved and removed, thereby a mask pattern having what is called a bridge construction is formed.

Specifically, the method of forming a thin film pattern according to the present embodiment includes a step of forming a mask pattern, a first-half step of patterning and a latter-half step of patterning as with the method of forming a thin film pattern according to the first embodiment. The step of forming a mask pattern includes steps of forming a photoresist pattern which has a groove-shaped opening and a pair of other openings connected to the both ends of the groove-shaped opening on a thin film 2Z provided on a substrate 1, forming an inorganic film by stacking in order a first inorganic layer and a second inorganic layer by a dry process so as to cover the upper surface of the photoresist pattern and the inside of the opening, removing the inorganic film formed on the upper surface of the photoresist pattern by a dry etching process, forming an inorganic mask pattern configured corresponding to the shape of the opening by removing the photoresist pattern, and forming a mask pattern by dissolving and removing, in the first inorganic layer included the inorganic mask pattern, a whole portion configured corresponding to the groove-shaped opening. Meanwhile, the first-half step of patterning and the latter-half step of patterning are the same as those of the first embodiment. Details will be described hereinbelow.

Figure 12A:
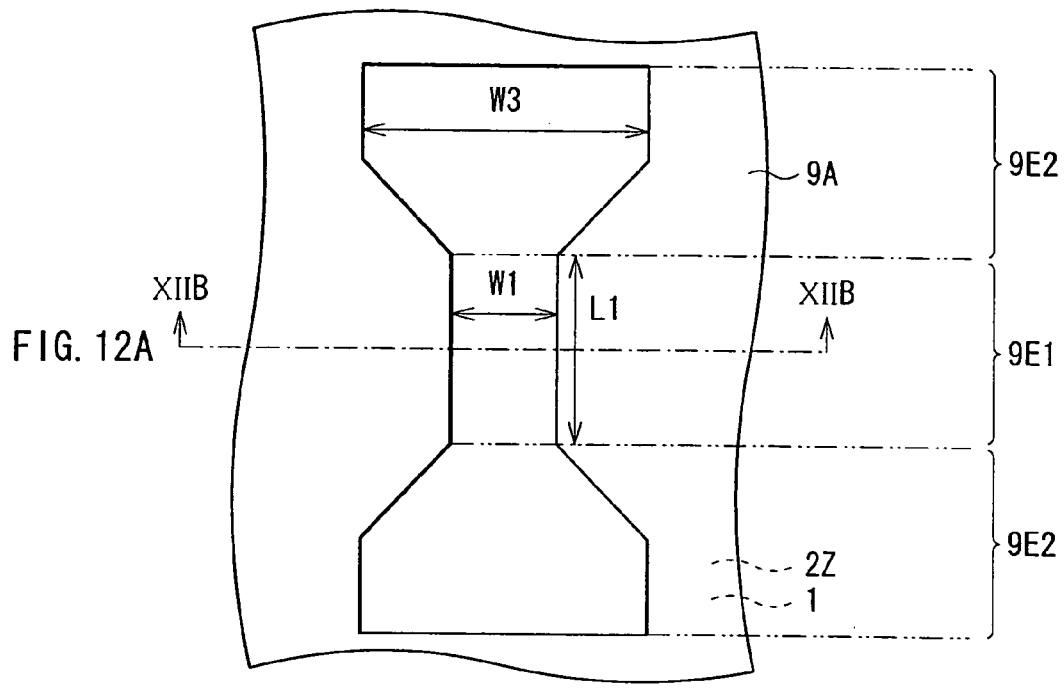
FIGS. 12A and 12B are a plan view and a sectional view of a step subsequent to FIGS. 11A and 11B.
Figure 12B:
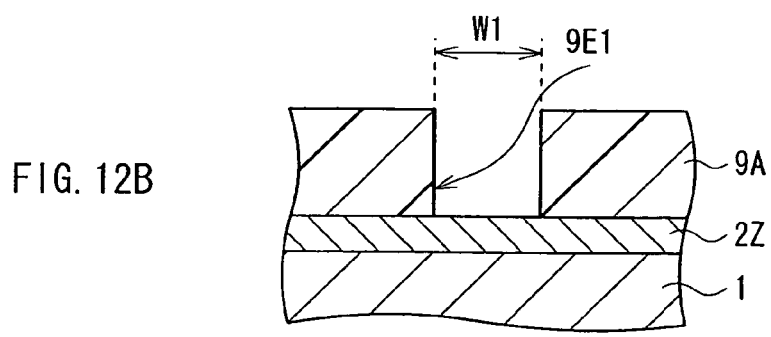
Figure 15A:
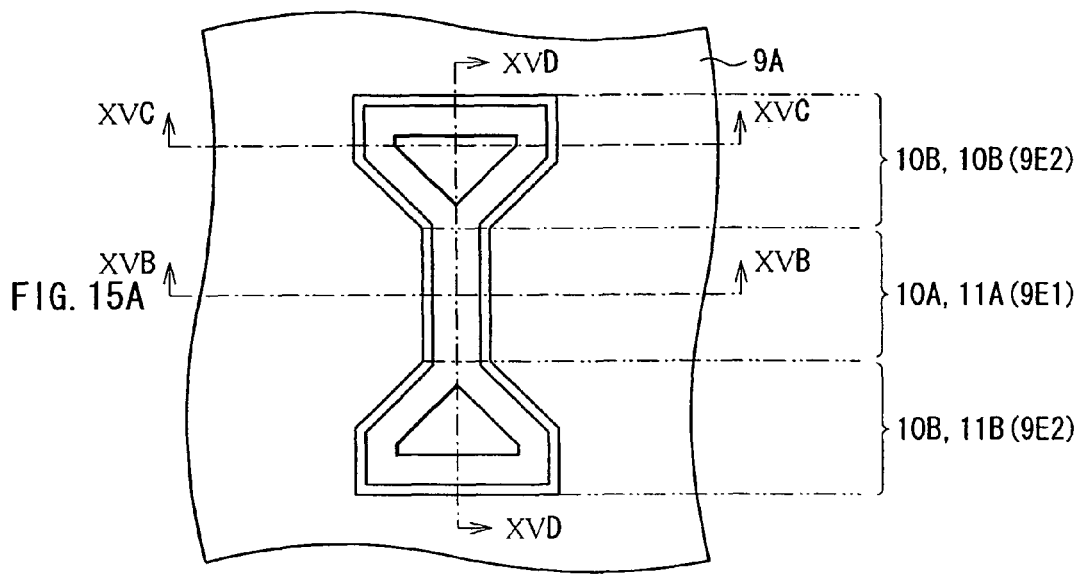
FIGS. 15A, 15B, 15C and 15D are a plan view and sectional views of a step subsequent to FIGS. 14A through 14D.
Figure 15B:
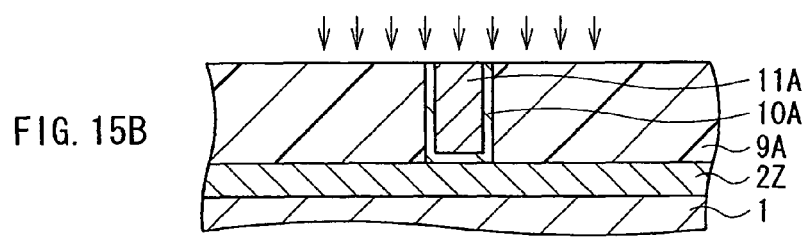
Figure 15C:
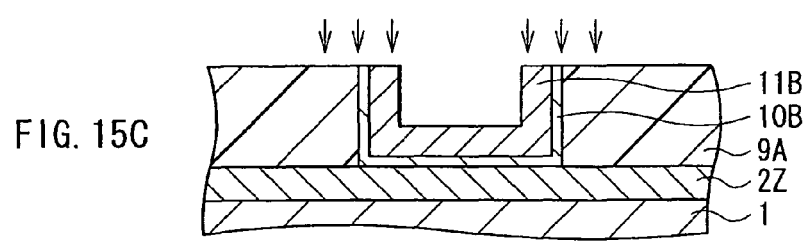
Figure 15D:
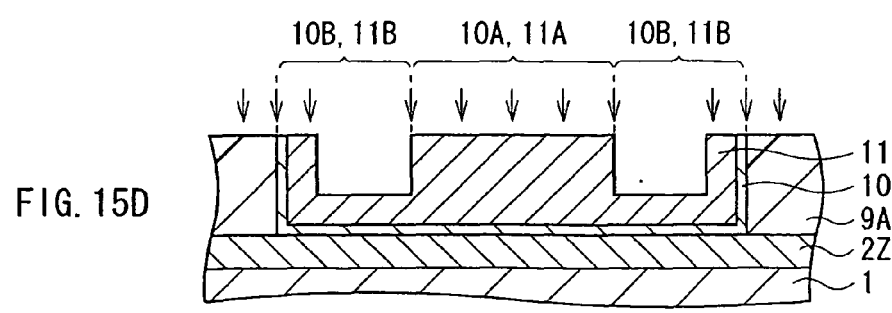
Figure 16A:
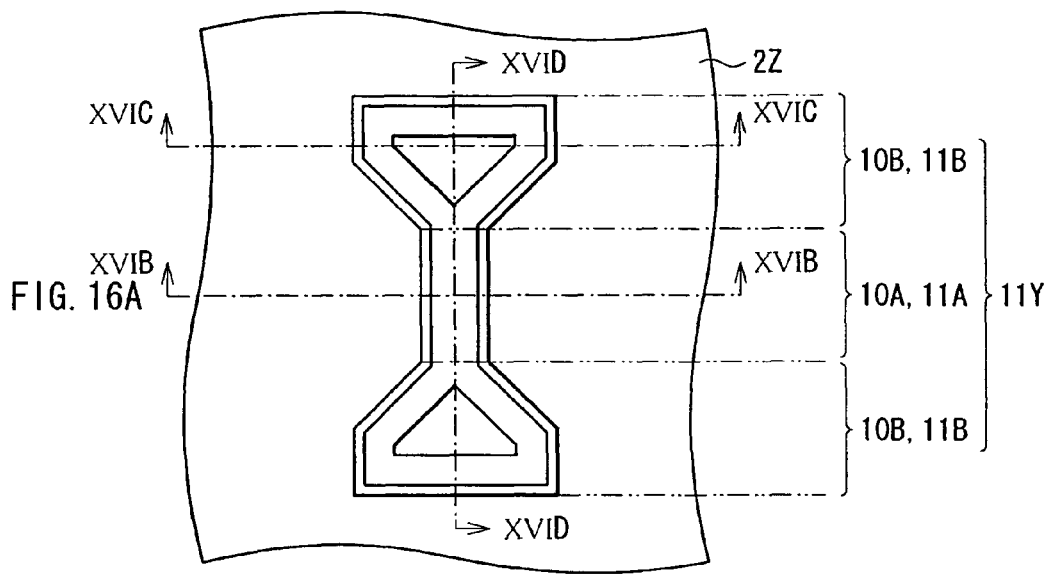
FIGS. 16A, 16B, 16C and 16D are a plan view and sectional views of a step subsequent to FIGS. 15A through 15D.
Figure 16B:
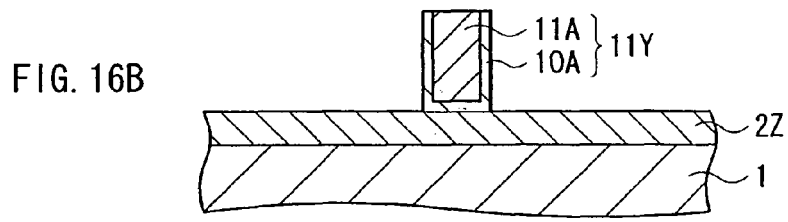
Figure 16C:
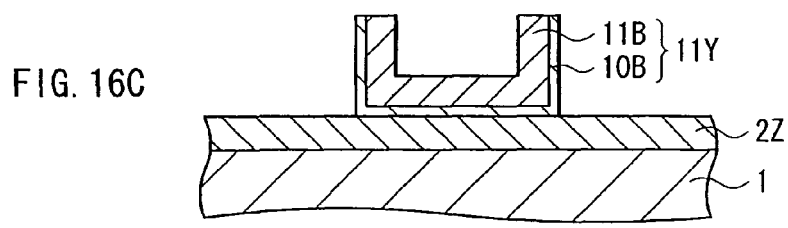
Figure 16D:
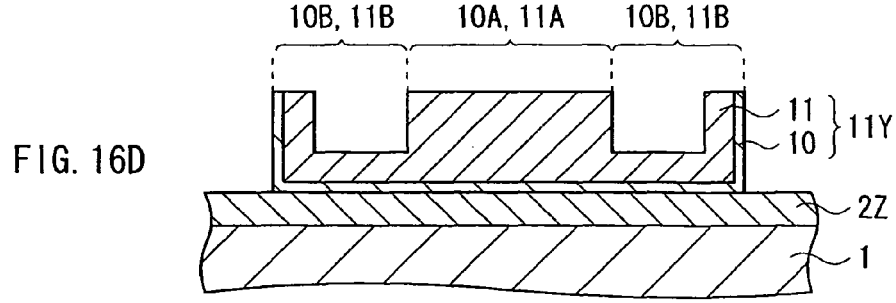

First is the step of forming a mask pattern. A photoresist layer 9 is formed by a spin coat method for example so as to cover the thin film 2Z formed all over the surface of the substrate 1, as with the first embodiment. Subsequently, a photoresist pattern 9A is formed by photolithography process applied to the photoresist layer 9 using a photo mask 4A as shown in FIG. 11A. The photo mask 4A has a slit-shaped opening having the width of 4AW1 and a pair of openings having the width of 4AW2 larger than the width 4AW1, connected to the both ends of the slit-shaped opening. In the photolithography process, as shown in FIG. 11B, the photoresist layer 9 is selectively exposed via the photo mask 4A to form a latent image portion 5A. After selectively forming the latent image in the photoresist layer 9, it is developed, washed and dried as with the first embodiment. In this manner, the photoresist pattern 9A, which has a groove-shaped opening 9E1 (groove-shaped opening) with the width W1 and the length L1 and a pair of openings 9E2 (other opening) connected to the both ends of the groove-shaped opening 9E1, is formed as shown in FIG. 12A. Here, the opening 9E2 has a width W3 larger than the width W1 of the opening 9E1. FIG. 12B is a cross-sectional configuration taken along the line XIIB-XIIB of FIG. 12A. After this, the inside dimensions of the openings 9E1 and 9E2 may be narrowed as necessary as with the first embodiment. Here, description is made on the assumption that in the opening 9E1, the width W1 and the length L1 have turned into a width W2 (W1>W2) and a length L2 (L1>L2) and in the opening 9E2, the width W3 has turned into a width W4 (W3>W4) through the narrowing process (refer to FIG. 13).

Subsequently, as shown in FIGS. 13 and 14, an inorganic layer 10 (first inorganic layer) and an inorganic layer 11 (second inorganic layer) are stacked in order so as to cover the upper surface of the photoresist pattern 9A and the inside of the openings 9E1 and 9E2 with dry processes such as CVD and sputtering, thereby forming an inorganic film. FIG. 13A shows a plan configuration of the photoresist pattern 9A covered with the inorganic layer 10, and FIG. 13B shows a cross-sectional configuration taken along the line XIIIB-XIIIB line of FIG. 13A. FIG. 13C shows a cross-sectional configuration taken along the line XIIIC-XIIIC of FIG. 13A, and FIG. 13D shows a cross-sectional configuration taken along the line XIIID-XIIID of FIG. 13A. The inorganic layer 10 here is a sacrificial layer at least part of which will be dissolved and removed to form an inorganic mask pattern 11Z as mentioned below. Namely, it is a layer for providing the mask pattern 11Z with a bridge construction or an undercut portion instead of working as a mask pattern in forming a thin film pattern 2A (first thin film pattern) as mentioned below. For this reason, the inorganic layer 10 is formed so as to uniformly cover the upper surface of the photoresist pattern 9A, the exposed portion of the thin film 2Z and the sidewall surface of the photoresist pattern 9A within the openings 9E1 and 9E2 in such a manner that the inorganic layer 10 does not thoroughly fill the openings 9E1 and 9E2 and leaves a space therein as shown in FIGS. 13B to 13D. As a dry process applied to form the inorganic layer 10, low-temperature CVD is suitable because that can prevent the photoresist pattern 9A from being deformed by heating, and that allows the material constituting the inorganic layer 10 to be accumulated isotropically to make the layer uniform. The thickness of the inorganic layer 10 here is of the order of 15 nm to 50 nm, for example. The material constituting the inorganic layer 10 is arbitrary if only it is easier to dissolve in a wet etching solution than the material constituting the inorganic layer 11. Examples of the material constituting the inorganic layer 10 include copper (Cu) and alumina.

FIG. 14A shows a plan configuration of the photoresist pattern 9A on which the inorganic layers 10 and 11 were stacked. FIG. 14B shows a cross-sectional configuration taken along the line XIVB-XIVB of FIG. 14A. FIG. 14C shows a cross-sectional configuration taken along the line XIVC-XIVC of FIG. 14A, and FIG. 14D shows a cross-sectional configuration taken along the line XIVD-XIVD of FIG. 14A. The inorganic layer 11 is formed to cover the whole surface of the inorganic layer 10. In areas 11A and 11B respectively corresponding to areas 10A and 10B of the inorganic layer 10, the inorganic layer 11 may be formed so as to fill the openings 9E1 and 9E2, or it may be formed so as not to fill the openings thoroughly. In this case, it is preferred to at least fill the area 11A as shown in FIGS. 14B and 14D. As described above, the material constituting the inorganic layer 11 is arbitrary if only it is more difficult to dissolve in a wet etching solution than the material constituting the inorganic layer 10. Examples of the material constituting the inorganic layer 11 may include alumina when the inorganic layer 10 is made of copper, and may include nickel when the inorganic layer 10 is made of alumina.

Subsequently, as shown in FIG. 15, the inorganic layers 10 and 11 provided on the upper surface of the photoresist pattern 9A are removed by a dry etching process. FIG. 15A shows a plan configuration of the photoresist pattern 9A on which the inorganic layers 10 and 11 are stacked. FIG. 15B shows a cross-sectional configuration taken along the line XVB-XVB of FIG. 15A. FIG. 15C shows a cross-sectional configuration taken along the line XVC-XVC of FIG. 15A. FIG. 15D shows a cross-sectional configuration taken along the line XVD-XVD of FIG. 15A. Here, over-etching is desirable, and it is preferred that the upper surface of the inorganic layers 10 and 11 provided in the openings 9E1 and 9E2 are over-etched until the height thereof is adjusted to the same level as that of the upper surface of the photoresist pattern 9A. As for the areas 10B and 11B, as shown in FIGS. 15C and 15D, an etching condition is determined not to etch at least the portion in contact with the thin film 2Z (namely, the bottom portion) in order to form a bridge construction as mentioned later.

Subsequently, as shown in FIG. 16, an inorganic mask pattern 11Y is formed by removing the photoresist pattern 9A as with the first embodiment. FIG. 16A shows a plan configuration of the inorganic mask pattern 11Y formed on the thin film 2Z. FIG. 16B shows a cross-sectional configuration taken along the line XVIB-XVIB of FIG. 16A. FIG. 16C shows a cross-sectional configuration taken along the line XVIC-XVIC of FIG. 16A. FIG. 16D shows a cross-sectional configuration taken along the line XVID-XVID of FIG. 16A. Subsequently, as shown in FIG. 17, a gap 10E is formed by dissolving and removing a whole portion of the area 10A, which is included in the inorganic layer 10 constituting the inorganic mask pattern 11Y, using a specified wet etching solution. In this case, in the area 10B, the inorganic layer 10 is partially removed to form an undercut portion 10C. In this manner, the mask pattern 11Z having a bridge construction is completed. FIG. 17A shows a plan configuration of the mask pattern 11Z formed on the thin film 2Z. FIG. 17B shows a cross-sectional configuration taken along the line XVIIB-XVIIB of FIG. 17A, and FIG. 17C shows a cross-sectional configuration taken along the line XVIIC-XVIIC of FIG. 17A, and FIG. 17D shows a cross-sectional configuration taken along the line XVIID-XVIID line of FIG. 17A. In this case, in the inorganic layer 10, a portion in contact with the sidewall of the inorganic layer 11 is also dissolved and removed by the wet etching process. As a result, the mask pattern 11Z is narrower in width than the inorganic mask pattern 11Y for the portion configured corresponding to the opening 9E1. In this manner, even without the above-mentioned step of narrowing the inside dimension of the openings 9E1 and 9E2 of the photoresist pattern 9A, it is possible to form a finer mask pattern with high resolution and precision. If the step of narrowing the inside dimension is further applied, that allows to form a still finer mask pattern with higher resolution and precision. On the other hand, it is desirable to foresee the decrease of the width in the portion configured corresponding to the opening 9E1 and adjust the width W1 (width W2) in the photoresist pattern 9A in view of the decrease. That is the end of the step of forming a mask pattern.

Next, the process goes to the first-half step of patterning. As shown in FIG. 18, the thin film 2Z is selectively etched by a dry etching process using the mask pattern 11Z as a mask, thereby forming the thin film pattern 2A. FIG. 18A shows a plan configuration of the mask pattern 11Z in this process, and FIG. 18B shows a cross-sectional configuration taken along the line XVIIIB-XVIIIB of FIG. 18A. In this case, since the mask pattern 11Z is etched together with the thin film 2Z, thickness thereof is decreased. Accordingly, it is desirable to foresee the decrease in thickness and form the inorganic layer 11 thick enough in advance to obtain a sufficient intensity. That is the end of the first-half step of patterning.

Figure 19A:
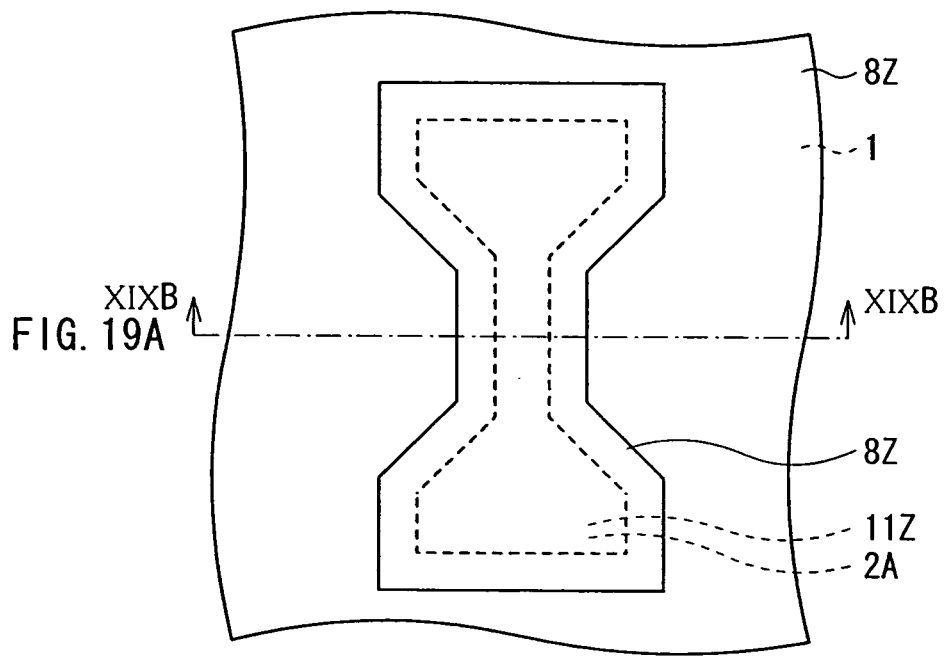
FIGS. 19A and 19B are a plan view and a sectional view of a step subsequent to FIGS. 18A and 18B.
Figure 19B:
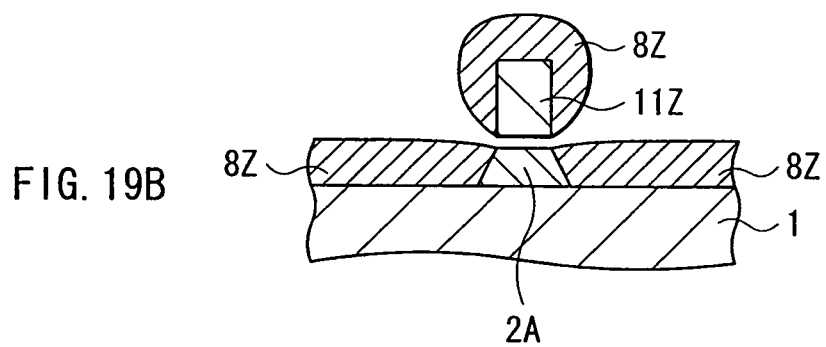

Next, the process goes to the latter-half step of patterning. First, as shown in FIG. 19, a thin film 8Z, which is a preliminary stage of a thin film pattern 8A as mentioned later, is formed so as to cover the substrate 1 exposed by etching and the mask pattern 11Z. FIG. 19A shows a plan configuration in the course of the process, and FIG. 19B shows a cross-sectional configuration taken along the line XIXB-XIXB of FIG. 19A.

Figure 20A:
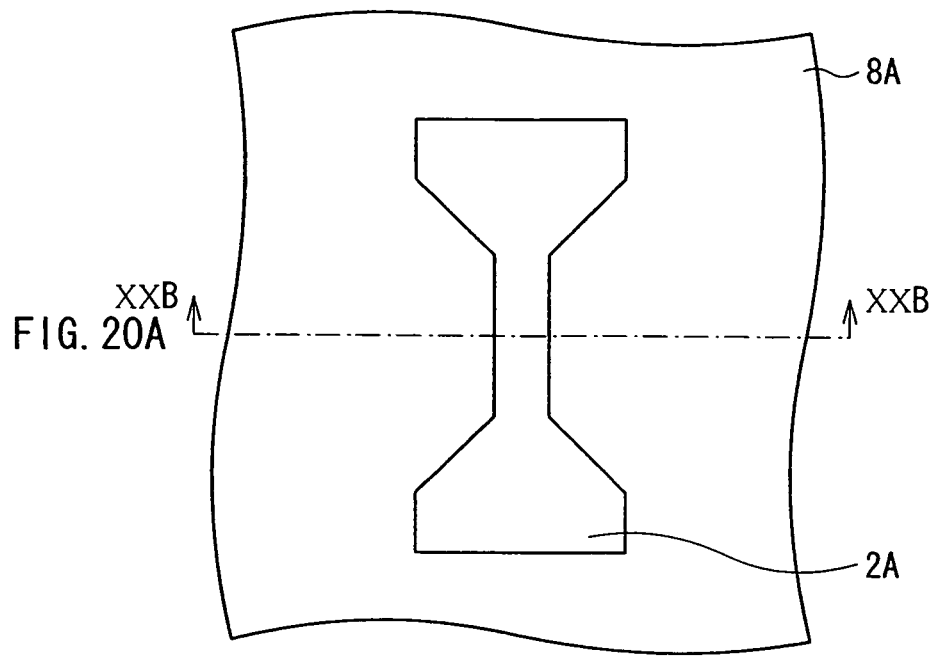
FIGS. 20A and 20B are a plan view and a sectional view of a step subsequent to FIGS. 19A and 19B.
Figure 20B:
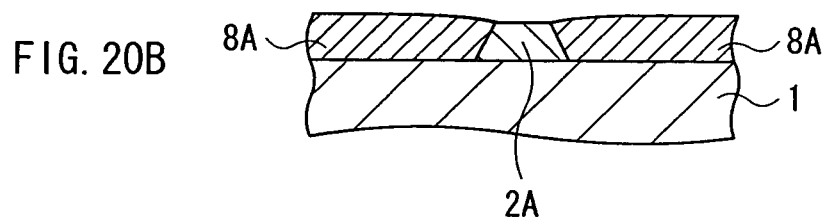

Finally, the mask pattern 11Z covered with the thin film 8Z is removed by a liftoff process. That is the end of the latter-half step of patterning. As a result, the thin film pattern 2A and the thin film pattern 8A adjoined thereto with the thin film pattern 2A in between is completed as shown in FIG. 20. Here, all the steps in the method of forming a thin film pattern in the present embodiment are completed.

As mentioned above, the present embodiment includes the steps of forming the photoresist pattern 9A which has a groove-shaped opening 9E1 and a pair of openings 9E2 connected to the both ends of the groove-shaped opening 9E1 on the thin film 2Z, forming an inorganic film by stacking the inorganic layer 10 and the inorganic layer 11 so as to cover the upper surface of the photoresist pattern 9A and the inside of the openings 9E1 and the 9E2, removing the inorganic film (inorganic layers 10 and 11) provided on the upper surface of the photoresist pattern 9A by a dry etching process, forming the inorganic mask pattern 11Y configured corresponding to the openings 9E1 and 9E2 by removing the photoresist pattern 9A, and forming a mask pattern 11Z having a bridge construction by dissolving and removing the whole portion of the area 10A, which is included in the inorganic layer 10 constituting the inorganic mask patterns 11Y. As a result, a mask pattern, which is hard to be deformed with higher structural stability and precision, is available. In this case, since the mask pattern 11Z has a bridge construction by dissolving and removing the whole portion of the area 10A, which is included in the inorganic layer 10 constituting the inorganic mask patterns 11Y, that allows the thin film to be patterned with higher resolution and precision as compared with the mask pattern (inorganic mask pattern 7Z) in the first embodiment. In this case, if the inside dimension of the openings 9E1 and 9E2 of the photoresist pattern 9A is processed to be narrowed, that allows the thin film to be patterned with much higher resolution and precision in particular. Thus according to the method of forming a thin film pattern in the present embodiment, since the thin film 2Z is selectively removed using the mask pattern 11Z, there are such advantages that the liftoff process becomes easy, formation of burr or the like is prevented, the fine thin film pattern 2A can be formed more easily with high resolution and precision as compared with the first embodiment in which the inorganic mask pattern 7Z is used. Since the present embodiment also includes the step of forming the thin film pattern 8A disposed on both sides of the thin film pattern 2A with the thin film pattern 2A in between, by forming the thin film 8Z so as to cover the area where the thin film 2Z has been removed and then lifting off the mask pattern 11Z covered with the thin film 8Z, the thin film pattern 8A can be adjoined with high precision to the thin film pattern 2A.

According to the present embodiment, after removing the photoresist pattern 9A, the gap 10E is formed by dissolving and removing the whole portion of the area 10A, which is included in the inorganic layer 10 constituting the inorganic mask patterns 11Y, thereby the mask pattern 11Z having a bridge construction is obtained. In this case, however, what is necessary is that only a part of the inorganic layer 10 is dissolved and removed. Namely, a portion of the inorganic layer 10 adjoining the sidewall of the inorganic layer 11 may be partially removed, or only the portion of the inorganic layer 10 adjoining the sidewall of the inorganic layer 11 may be entirely removed. It is also possible to form an undercut portion in the mask pattern by removing the both-ends, as viewed in the width direction, of the inorganic layer 10 located under the inorganic layer 11. In any case, similar or even higher performance is available as compared with the first embodiment, in which the thin film pattern is formed using the inorganic mask pattern 7Z.

Figure 21A:
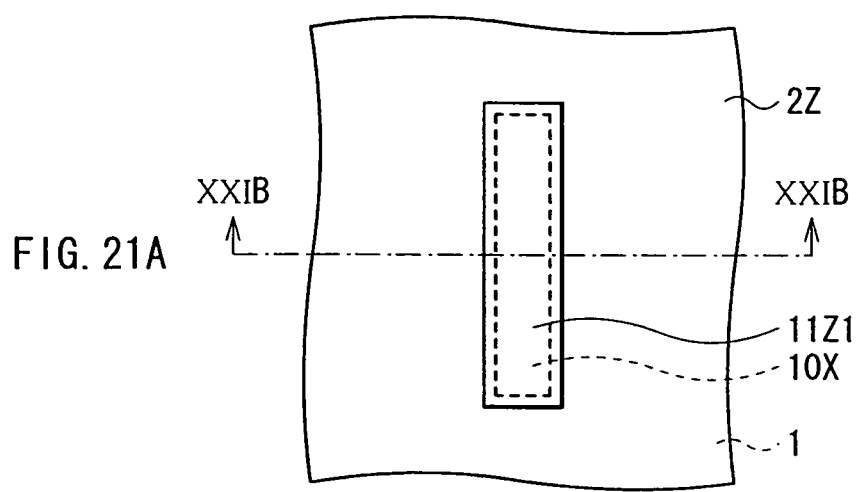
FIGS. 21A and 21B are a plan view and a sectional view showing a modification of mask pattern in the method of forming a thin film pattern according to the second embodiment of the present invention.
Figure 21B:
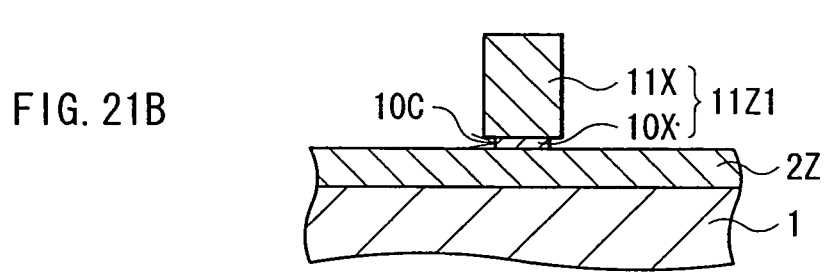

In addition, in the present embodiment, the mask pattern 11Z is formed by forming the inorganic film, in which the first inorganic layer and the second inorganic layer are stacked in order using the photoresist pattern 9A, to cover the photoresist pattern 9A. However, the long and slender-shaped mask pattern may be formed using the photoresist pattern 3A employed in the first embodiment. In this case, the method of forming a mask pattern includes steps of forming an inorganic film by stacking a first inorganic layer (10X) and a second inorganic layer (11X) in order so as to cover the upper surface of the photoresist pattern 3A and the inside of the opening 3E, removing the inorganic film for a portion stacked on the upper surface of the photoresist pattern 3A by a dry etching process, forming the inorganic mask pattern configured corresponding to the inner shape of the opening 3E by removing the photoresist pattern 3A, and further, dissolving and removing at least both-ends, as viewed in the width direction, of an outer edge portion of the first inorganic layer. In this manner, a mask pattern 11Z1, which has an undercut portion 10C, can be formed as shown in FIG. 21, for example. Also in this case, similar or even higher performance is available as compared with the first embodiment, in which the thin film pattern is formed using the inorganic mask pattern 7Z. It is to be noted that FIG. 21A shows a plan configuration of the mask pattern 11Z1 formed on the thin film 2Z, and FIG. 21B shows a cross-sectional configuration taken along the line XXIB-XXIB of FIG. 21A.

Although, in the present embodiment, the thin film pattern is formed in a series of flows including the step of forming a mask pattern, the first-half step of patterning, and the latter-half step of patterning, it is not limited to this. For example, the step of forming a mask pattern may be followed by the first-half step of patterning and be completed there. It is also possible that the step of forming a mask pattern may be followed by the latter-half step of patterning. In the case of completing the process by the first-half step of patterning, the thin film 2Z is selectively etched by a dry etching process as shown in FIGS. 18A and 18B to form the thin film pattern 2A, then the inorganic mask pattern 11Z is removed. The case where the step of forming a mask pattern is followed by the latter-half step of patterning will comply with the method of forming a thin film pattern according to a fourth embodiment as described later. In this manner, the thin film pattern, which has an opening configured corresponding to the mask pattern, will be formed.

[Third Embodiment]

Subsequently, a method of forming a thin film pattern according to a third embodiment of the present invention will be described hereinbelow with reference to FIGS. 22 to 31.

In the first embodiment, the inorganic film 7 is formed as one unit as shown in FIG. 5 using the photoresist pattern 3A with the groove-shaped opening 3E provided on the thin film 2Z as shown in FIG. 3. Then, as shown in FIG. 7, the long and slender inorganic mask pattern 7Z is formed. In the second embodiment, the photoresist pattern 9A is formed to have the pair of other openings 9E2 connected to the both ends of the groove-shaped opening 9E1 on the thin film 2Z as shown in FIG. 12, the inorganic film is formed by stacking the inorganic layer 10 and the inorganic layer 11 in order as shown in FIGS. 13 and 14, then the photoresist pattern 9A is removed, thereby obtaining the inorganic mask pattern 11Y. After this, as shown in FIG. 17, the area 10A, which is included in the inorganic layer 10 constituting the inorganic mask pattern 11Y has been dissolved and removed, thereby obtaining the mask pattern 11Z having a bridge construction. On the other hand, in the present embodiment, a mask pattern having an undercut structure is formed by, after forming a soluble layer on the thin film 2Z, forming a photoresist pattern on the soluble layer in a manner similar to the first embodiment, forming an inorganic film using the photoresist pattern, and dissolving and removing a part of an outer edge of the soluble layer located under an inorganic mask pattern.

Specifically, the method of forming a thin film pattern according to the present embodiment includes, as with the method of forming a thin film pattern of the first embodiment, a step of forming a mask pattern, a first-half step of patterning, and a latter-half step of patterning. The step of forming a mask pattern here includes steps of forming a soluble layer on a thin film 2Z provided on a substrate 1, forming a photoresist pattern which has a groove-shaped opening on the soluble layer, forming an inorganic film by a dry process so as to cover the upper surface of the photoresist pattern and the inside of the opening, removing the inorganic film on the upper surface of the photoresist pattern by a dry etching process, forming an inorganic mask pattern configured corresponding to the inner shape of the opening (long and slender shape) after removing the photoresist pattern, and forming a mask pattern having an undercut structure by dissolving and removing at least both-ends, as viewed in the width direction, of the soluble layer located under the inorganic mask pattern. Meanwhile, the first-half step of patterning and the latter-half step of patterning are the same as those of the first and second embodiments. Hereafter, details will be described.

Figure 22:
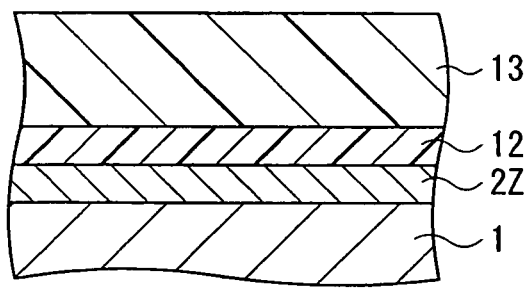
FIG. 22 is a sectional view showing a step in the method of forming a thin film pattern according to a third embodiment of the present invention.

First is the step of forming a mask pattern. First, as shown in FIG. 22, a soluble layer 12 and a photoresist layer 13 are stacked in order by a spin coat method so as to cover a thin film 2Z, which is a preliminary stage of a first thin film pattern formed in the same manner as the first embodiment. Here, the soluble layer 12 is formed, for example, to the thickness of the order of 20 nm to 50 nm using alkali soluble resin such as polymethyl glutar imide (PMGI). Then, the photoresist layer 13 is formed as with the photoresist layer 3.

Figure 23:
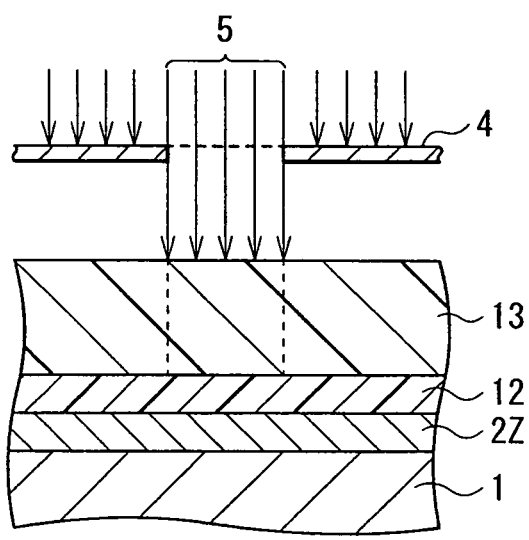
FIG. 23 is a sectional view of a step subsequent to FIG. 22.

Subsequently, a photoresist pattern 13A having an opening 13E is formed as shown in FIG. 24 with photolithography applied to the photoresist layer 13, as shown in FIG. 23. Here, the application of photolithography is performed using a photo mask 4 as shown in FIG. 2A, thereby obtaining the photoresist pattern 13A having a groove-shaped opening 13E with the width W1 and the length L1. In this case, the application of photolithography is performed in the same manner as in the first embodiment except that the developing time is reduced so as not to dissolve the soluble layer 12. The configuration of the photoresist pattern 13A is the same as that of the photoresist pattern 3A, which has the opening 3E, as shown in FIG. 3. FIG. 24A shows a plan configuration of the photoresist pattern 13A, and FIG. 24B shows a cross-sectional configuration taken along the line XXIVB-XXIVB of FIG. 24A. After this, the inside dimension of the opening 13E may be narrowed as with the first embodiment as necessary. Hereinbelow, description will be made on the assumption that in the opening 13E, the width W1 and the length L1 have turned into a width W2 (W1>W2) and a length L2 (L1>L2) through the above-mentioned narrowing step (refer to FIG. 25).

Figures 25A, 25B:
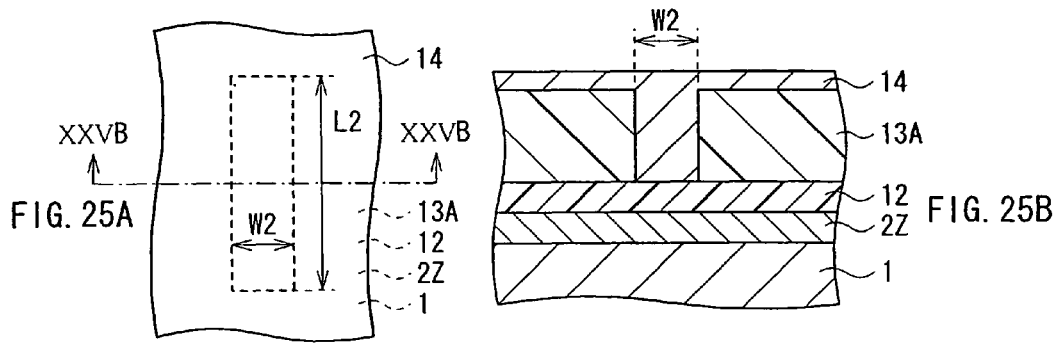
FIGS. 25A and 25B are a plan view and a sectional view of a step subsequent to FIGS. 24A and 24B.

Subsequently, an inorganic film 14 is formed so as to cover the upper surface of the photoresist pattern 13A and the inside of the opening 13E by a dry process such as CVD, as shown in FIG. 25. FIG. 25A shows a plan configuration of the photoresist pattern 13A covered with the inorganic film 14, and FIG. 25B shows a cross-sectional configuration taken along the line XXVB-XXVB of FIG. 25A. Examples of the material constituting the inorganic film 14 are similar to those constituting the inorganic film 7. The inorganic film 14 formed in this manner covers the upper surface of the photoresist pattern 13A, an exposed portion of the soluble layer 12 and the wall surface of the photoresist pattern 13A within the opening 13E. In this case, the inorganic film 14 may fill the opening 13E, or may not thoroughly fill the opening 13E so that the cross-sectional configuration thereof may be a tuning fork in shape or U-shaped, as with the above-mentioned inorganic film 7.

Figures 26A, 26B:
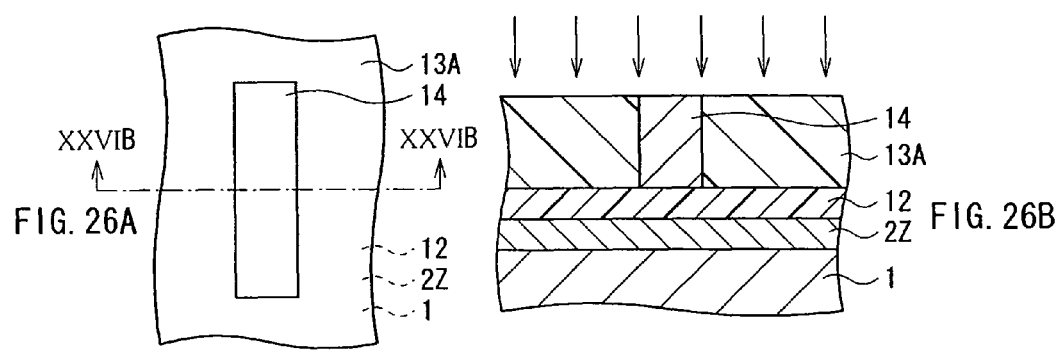
FIGS. 26A and 26B are a plan view and a sectional view of a step subsequent to FIGS. 25A and 25B.

Subsequently, as shown in FIG. 26, the inorganic film 14 formed on the upper surface of the photoresist pattern 13A is removed by a dry etching process. FIG. 26A shows a plan configuration of the photoresist pattern 13A and the inorganic film 14, and FIG. 26B shows a cross-sectional configuration taken along the line XXVIB-XXVIB of FIG. 26A. In this case, over-etching is desirable, and it is preferred that the upper surface of the inorganic film 14 provided in the opening 13E is over-etched until the height thereof is adjusted to the same level as that of the upper surface of the photoresist pattern 13A.

Figures 27A, 27B:
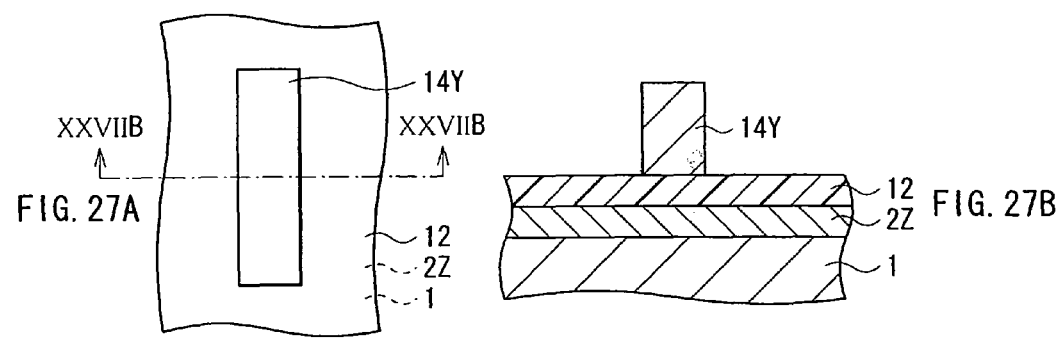
FIGS. 27A and 27B are a plan view and a sectional view of a step subsequent to FIGS. 26A and 26B.
Figures 28A, 28B:
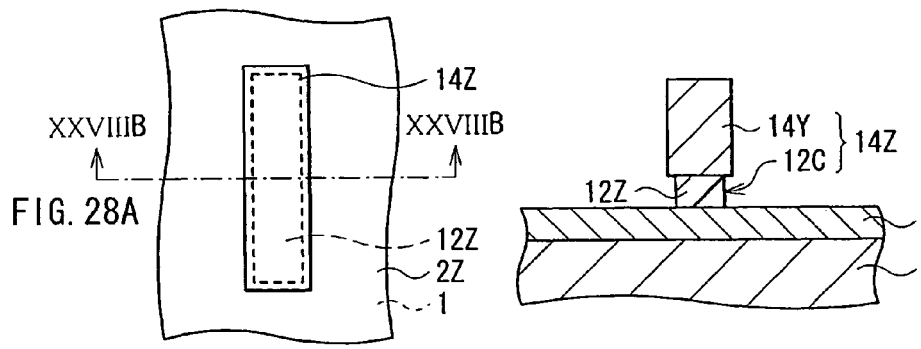
FIGS. 28A and 28B are a plan view and a sectional view of a step subsequent to FIGS. 27A and 27B.

Subsequently, the inorganic mask pattern 14Y configured corresponding to the inner shape of the opening 13E is formed by removing the photoresist pattern 13A, as shown in FIG. 27. After that, in the soluble layer 12 located under the inorganic mask pattern 14Y, an outer edge thereof is dissolved and removed as shown in FIG. 28, thereby an undercut structure 12C is obtained. Here, the soluble layer 12 is turned into a soluble layer 12Z. FIG. 27A and FIG. 28A show plan configurations of the inorganic mask pattern 14Y. FIG. 27B shows a cross-sectional configuration taken along the line XXVIIB-XXVIIB of FIG. 27A, and FIG. 28B shows a cross-sectional configuration taken along the line XXVIIIB-XXVIIIB of FIG. 28A. Here, examples of solution for dissolving the soluble layer 12 include an alkaline aqueous solution. In this case, when the material constituting the inorganic film 14 is soluble in alkaline aqueous solutions, such as alumina, it is to be noted that the concentration of the solution for dissolving the soluble layer 12 shall be determined so as not to dissolve the inorganic film 14. In this manner, the mask pattern 14Z having the undercut structure 12C is completed. That is the end of the step of forming a mask pattern.

Figure 29:
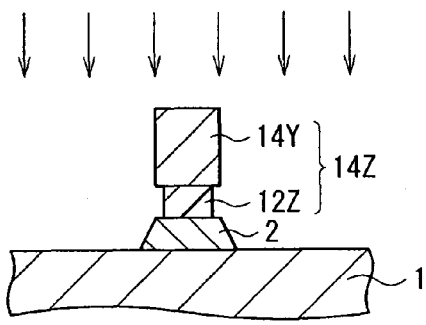
FIG. 29 is a sectional view of a step subsequent to FIGS. 28A and 28B.

Next, the process goes to the first-half step of patterning. As shown in FIG. 29, the thin film 2Z is selectively etched by a dry etching process using the mask pattern 14Z as a mask, thereby obtaining a thin film pattern 2 or a first thin film pattern. In this case, since the mask pattern 14Z is etched together with the thin film 2Z, thickness thereof will decrease. Therefore, it is desirable to foresee the decrease in thickness and form the inorganic film 14 thick enough in advance to obtain a sufficient intensity. It is to be noted that FIG. 29 shows a cross-sectional configuration corresponding to FIG. 28B. That is the end of the first-half step of patterning.

Figure 30:
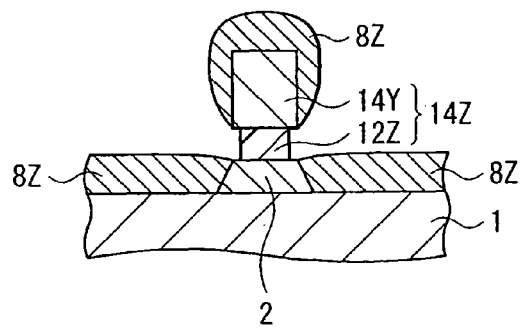
FIG. 30 is a sectional view of a step subsequent to FIG. 29.

Next, the process goes to the latter-half step of patterning. First, as shown in FIG. 30, a thin film 8Z, which is a preliminary stage of a second thin film pattern, is formed so as to cover a substrate 1 exposed by etching and the mask pattern 14Z.

Figure 31:
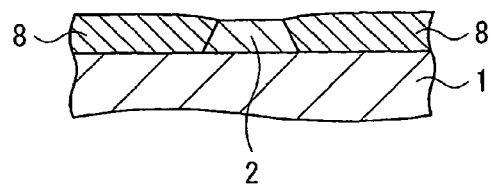
FIG. 31 is a sectional view subsequent to FIG. 30.

Then, finally, the mask pattern 14Z covered with the thin film 8Z is removed by a liftoff process. That is the end of the latter-half step of patterning. As a result, the thin film pattern 2 and the thin film pattern 8 adjoined thereto with the thin film pattern 2 in between is completed as shown in FIG. 31. Here, all the steps of forming the thin film pattern in the present embodiment are completed.

As mentioned above, the present embodiment includes the steps of forming the soluble layer 12 on the thin film 2Z and forming the photoresist pattern 13A having the opening 13E on the soluble layer 12, forming the inorganic film 14 by a dry process so as to cover the upper surface of the photoresist pattern 13A and the inside of the opening 13E, removing the inorganic film 14 on the upper surface of the photoresist pattern 13A by a dry etching process, forming the inorganic mask pattern 14Y configured corresponding to the inner shape of the opening 13E after removing the photoresist pattern 13A, and forming an undercut structure 12C by dissolving and removing at least both-ends, as viewed in the width direction, of the soluble layer 12 located under the inorganic mask pattern 14Y. As a result, the mask pattern 14Z, which is hard to be deformed with higher structural stability and precision, is available. In this case, since the undercut structure 12C is formed in particular, a fine thin film pattern can be formed more easily with higher resolution and precision as compared with the first embodiment in which the inorganic mask pattern 7Z is used. In this case, if the inside dimension of the opening 13E of the photoresist pattern 13A is processed to be narrowed, in particular, that allows the thin film to be patterned with much higher resolution and precision. Thus according to the method of forming a thin film pattern in the present embodiment, since the thin film 2Z is selectively removed using the mask pattern 14Z, formation of burr or the like can be prevented and the fine thin film pattern 2 can be formed more easily with high resolution and precision as compared with the first embodiment in which the inorganic mask pattern 7Z is used. Since the present embodiment also includes the step of forming the thin film pattern 8 disposed on both sides of the thin film pattern 2 with the thin film pattern 2 in between, by forming the thin film 8Z so as to cover the area where the thin film 2Z has been removed and then lifting off the mask pattern 14Z covered with the thin film 8Z, the thin film pattern 8 can be adjoined to the thin film pattern 2 with high precision.

Figure 32A:
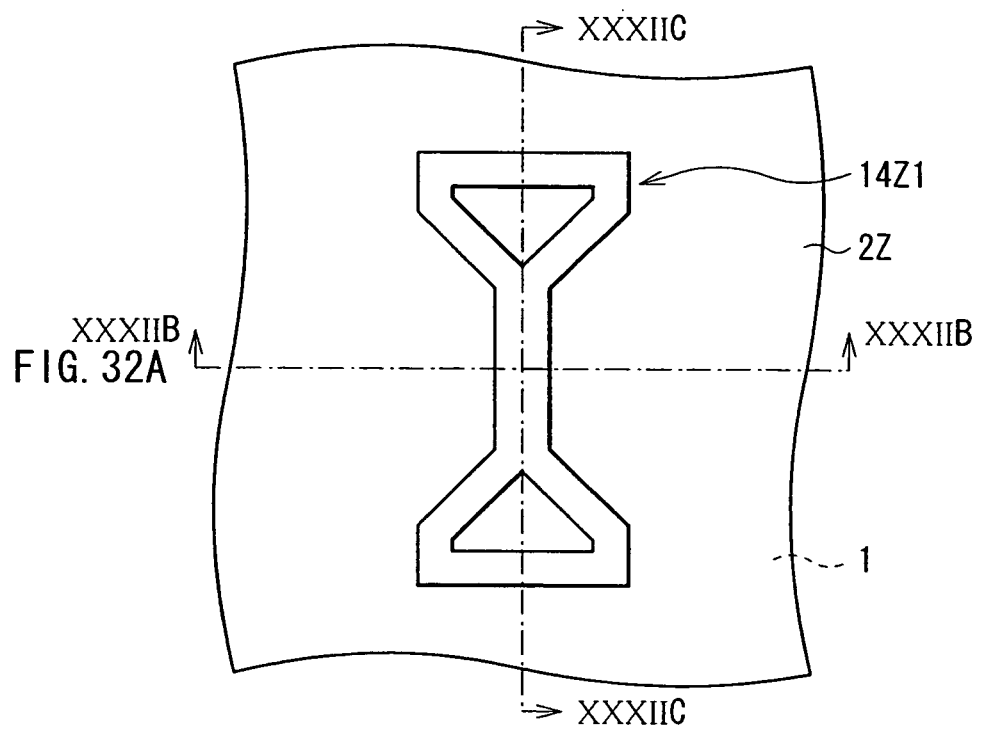
FIGS. 32A, 32B and 32C are a plan view and sectional views showing a modification of mask pattern in the method of forming a thin film pattern according to the third embodiment of the present invention.
Figure 32B:
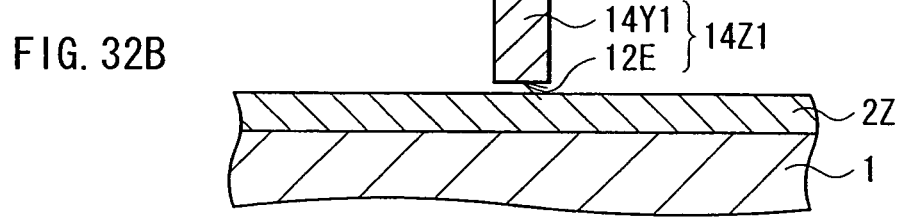
Figure 32C:
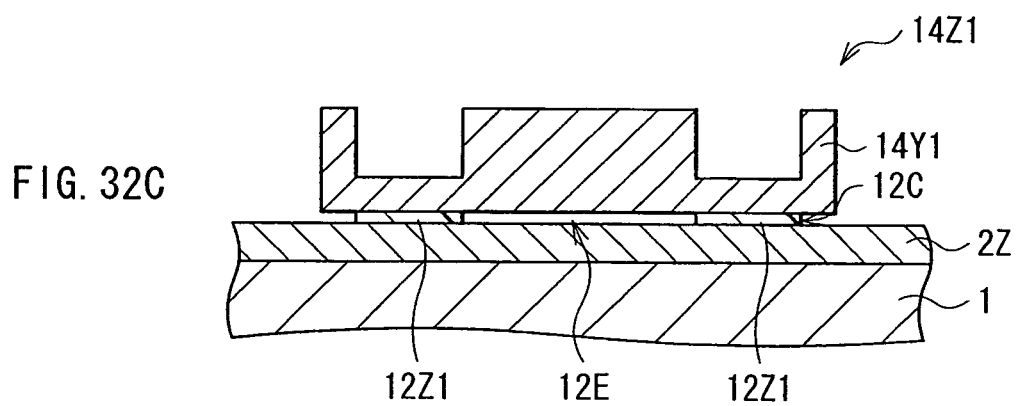

In the present embodiment, although the mask pattern 14Z having the undercut structure 12C is formed using the photoresist pattern 13A, it may be formed by forming the photoresist pattern 9A, which is employed in the second embodiment, on the soluble layer 12 before the inorganic film 14 is formed. In this case, the process includes steps of forming the photoresist pattern 9A having the pair of openings 9E2 connected to the both ends of the groove-shaped opening 9E1 on the soluble layer 12, forming the inorganic film 14 by a dry process so as to cover the upper surface of the photoresist pattern 9A and inside of the openings 9E1 and 9E2, removing the inorganic film 14 on the upper surface of the photoresist pattern 9A by a dry etching process, forming an inorganic mask pattern 14Y1 after removing the photoresist pattern 9A, and dissolving and removing a whole portion of the soluble layer 12 located under the inorganic mask pattern 14Y1 configured corresponding to the grooved opening 9E1. In this manner, as shown in FIG. 32, a gap 12E is formed, thereby obtaining a mask pattern 14Z1 having a bridge construction. FIG. 32A shows a plan configuration of the mask pattern 14Z1 formed on the thin film 2Z, FIG. 32B shows a cross-sectional configuration taken along the line XXXIIB-XXXIIB of FIG. 32A, and FIG. 32C shows a cross-sectional configuration taken along the line XXXIIC-XXXIIC of FIG. 32A. Even in this case, of course, what is necessary is just that the soluble layer 12 located under the inorganic mask pattern 14Y1 is partially dissolved and removed, and it is enough if, at least both ends, as viewed in the width direction, of a portion of the soluble layer 12 under the inorganic mask pattern 14Y1 configured corresponding to the groove-shaped opening are dissolved and removed. In any case, there are such advantages that liftoff process becomes easy, generation of burrs or the like can be prevented, and higher performance is available as compared with the first embodiment in which a thin film pattern is formed using the inorganic mask pattern 7Z.

In the present embodiment, although the soluble layer 12 is obtained by forming a layer made of alkali soluble resin by a spin coat method, the soluble layer may be obtained with typically a dry process, by forming an inorganic film that will dissolve by wet etching. Examples of material constituting the soluble layer in this case may include copper and alumina. Even in this case, effects similar to the above are available as well.

Further, in the present embodiment, although the thin film pattern is formed in a series of flows including the step of forming a mask pattern, the first-half step of patterning and the latter-half step of patterning, it is not limited to this. For example, the step of forming a mask pattern may be followed by the first-half step of patterning and be completed there. It is also possible that the step of forming a mask pattern may be followed by the latter-half step of patterning. In the case of completing the process by the first-half step of patterning, the thin film 2Z is selectively etched by a dry etching process as shown in FIG. 29 to form the thin film pattern 2, then the mask pattern 14Z is removed. The case where the step of forming a mask pattern is followed by the latter-half step of patterning will comply with the method of forming a thin film pattern according to a fourth embodiment as mentioned below. In this manner, the thin film pattern, which has an opening configured corresponding to the mask pattern, will be formed.

[Fourth Embodiment]

Subsequently, a method of forming a thin film pattern according to a fourth embodiment of the present invention will be described with reference to FIGS. 33 to 39.

In the first to third embodiments, the thin film pattern with an isolated line shape is formed by forming an isolated mask pattern on a film to be patterned (thin film to be processed; the thin film 2Z). On the other hand, in the present embodiment, an isolated mask pattern is formed on a substrate, thereby a thin film pattern having a groove-shaped opening is formed.

Specifically, the method of forming a thin film pattern in the present embodiment includes steps of forming a mask pattern and patterning. The step of forming a mask pattern includes steps of forming a photoresist pattern having an opening on a substrate, forming an inorganic film so as to cover the upper surface of the photoresist pattern and the inside of the opening by a dry process, removing the inorganic film on the upper surface of the photoresist pattern by a dry etching process, and forming an inorganic mask pattern configured corresponding to the inner shape of the opening by removing the photoresist pattern. The step of patterning here includes steps of forming a thin film so as to cover the substrate and the inorganic mask pattern and lifting off the inorganic mask pattern. Hereafter, details will be described.

Figure 33:
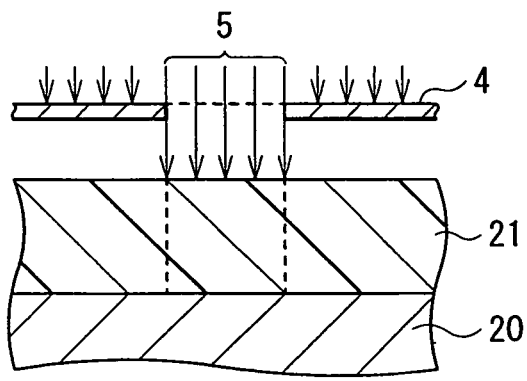
FIG. 33 is a sectional view of a step in the method of forming a thin film pattern according to a fourth embodiment of the present invention.
Figure 34A:
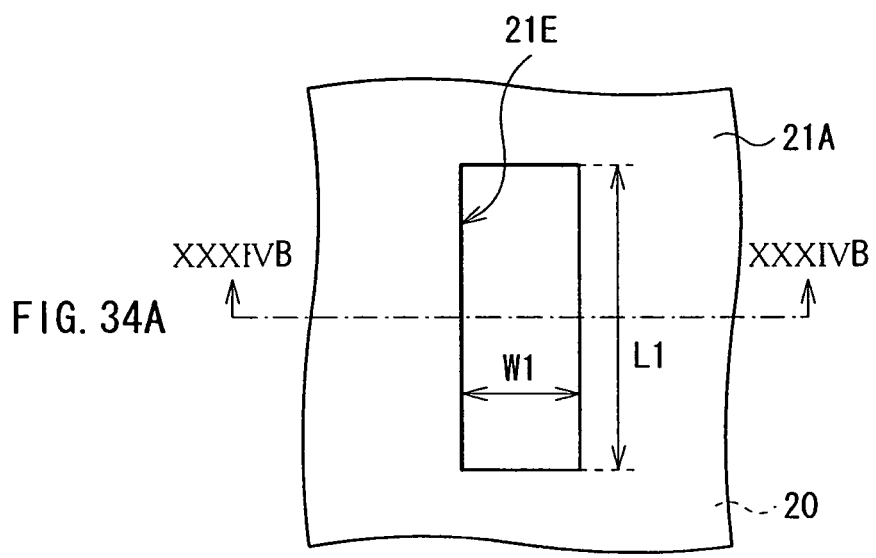
FIGS. 34A and 34B are a plan view and a sectional view of a step subsequent to FIG. 33.
Figure 34B:
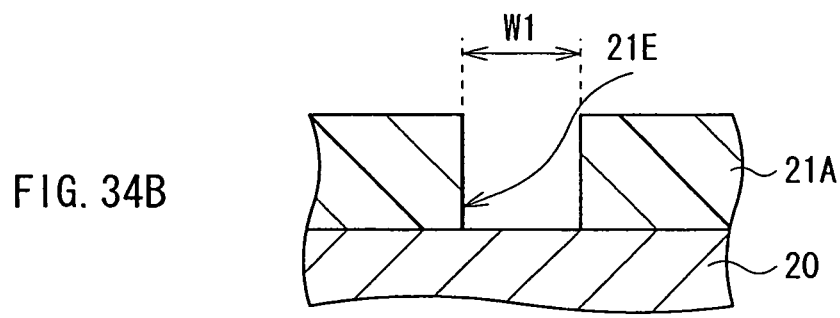

First is the step of forming a mask pattern. First, a photoresist layer 21 is formed on a substrate 20 as with the photoresist layer 3 (13). Subsequently, photolithography process is applied to the photoresist layer 21 as shown in FIG. 33, thereby obtaining a photoresist pattern 21A which has an opening 21E as shown in FIG. 34. In this case, the photolithography process is performed using the photo mask 4 as shown in FIG. 2A, as with the first embodiment. The configuration of the photoresist pattern 21A is the same as that of the photoresist pattern 3A, which has the opening 3E, as shown in FIG. 3. It is to be noted that FIG. 34A shows a plan configuration of the photoresist pattern 21A, and FIG. 34B shows a cross-sectional configuration taken along the line XXXIVB-XXXIVB of FIG. 34A. After this, the inside dimension of the opening 21E may be narrowed as necessary, as with the first embodiment. Here, it is assumed that in the opening 21E, the width W1 and the length L1 have turned into a width W2 (W1>W2) and a length L2 (L1>L2) through the above-mentioned narrowing process (refer to FIG. 35).

Figures 35A, 35B:
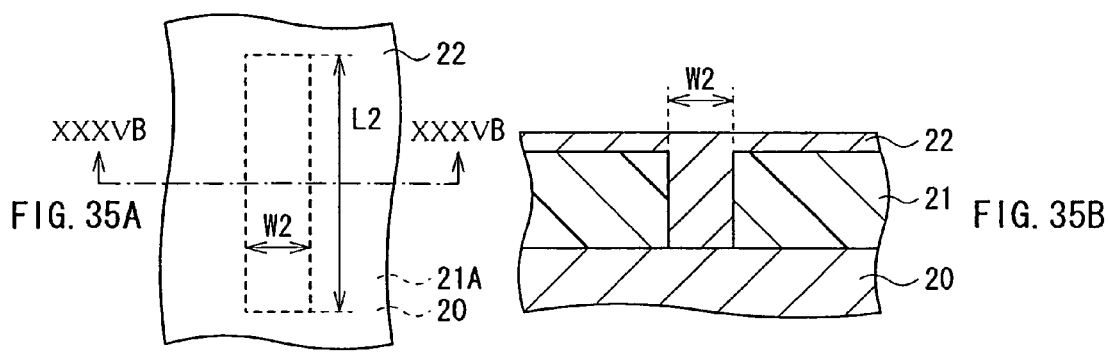
FIGS. 35A and 35B are a plan view and a sectional view of a step subsequent to FIGS. 34A and 34B.

Subsequently, as shown in FIG. 35, an inorganic film 22 is formed so as to cover the upper surface of the photoresist pattern 21A and the inside of the opening 21E by a dry process such as CVD. FIG. 35A shows a plan configuration of the photoresist pattern 21A covered with the inorganic film 22, and FIG. 35B shows a cross-sectional configuration taken along the line XXXVB-XXXVB of FIG. 35A. Examples of a material constituting the inorganic film 22 are similar to that constituting the inorganic film 7. The inorganic film 22 formed in this manner is formed to cover the upper surface of the photoresist pattern 21A, an exposed portion of the substrate 20 and the wall surface of the photoresist pattern 21A within the opening 21E. In this case, the inorganic film 22 may fill the opening 21E, or may not thoroughly fill the opening 21E so that the cross-sectional configuration thereof may be a tuning fork in shape or U-shaped, as with the above-mentioned inorganic film 7.

Figures 36A, 36B:
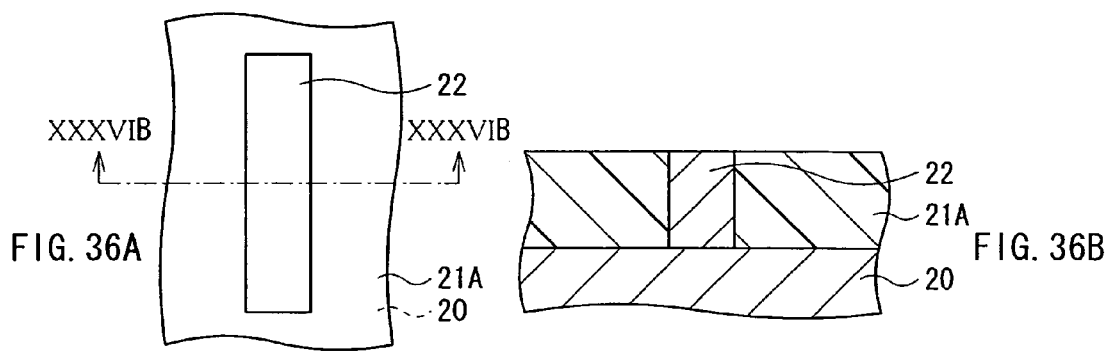
FIGS. 36A and 36B are a plan view and a sectional view of a step subsequent to FIGS. 35A and 35B.

Subsequently, as shown in FIG. 36, the inorganic film 22 formed on the upper surface of the photoresist pattern 21A is removed by a dry etching process. FIG. 36A shows a plan configuration of the photoresist pattern 21A and the inorganic film 22, and FIG. 36B shows a cross-sectional configuration taken along the line XXXVIB-XXXVIB of FIG. 36A. In this case, over-etching is desirable, and it is preferred that the upper surface of the inorganic film 22 provided in the opening 21E is over-etched until the height thereof is adjusted to the same level as that of the upper surface of the photoresist pattern 21A.

Figures 37A, 37B:
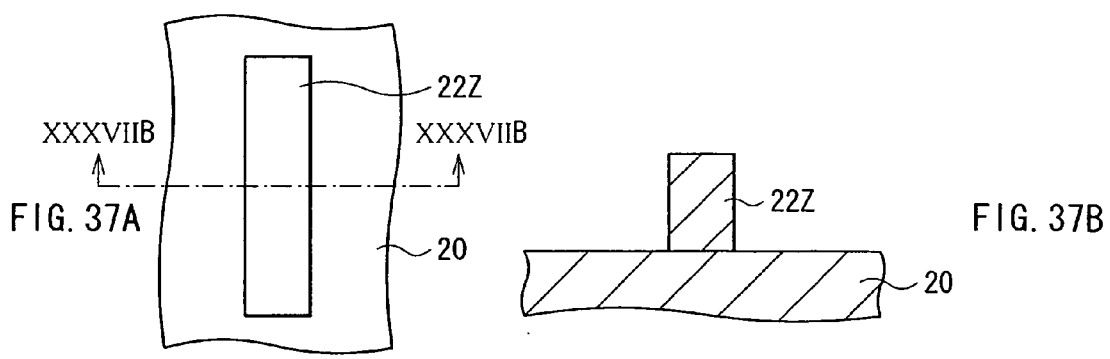
FIGS. 37A and 37B are a plan view and a sectional view of a step subsequent to FIGS. 36A and 36B.

Subsequently, the inorganic mask pattern 22Z is completed by removing the photoresist pattern 21A, as shown in FIG. 37. FIG. 37A shows a plan configuration of the inorganic mask pattern 22Z, and FIG. 37B shows a cross-sectional configuration taken along the line XXXVIIB-XXXVIIB of FIG. 37A. That is the end of the step of forming a mask pattern.

Figure 38:
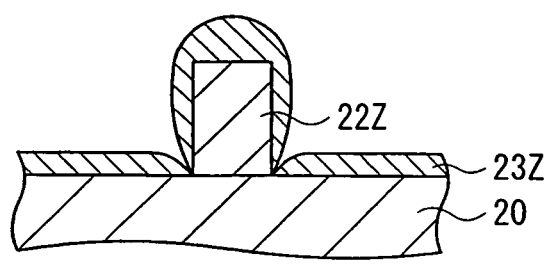
FIG. 38 is a sectional view of a step subsequent to FIGS. 37A and 37B.
Figure 39:
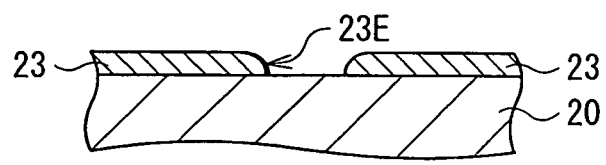
FIG. 39 is a sectional view of a step subsequent to FIG. 38.

Next, the process goes to the step of patterning. The step of patterning here is executed in a manner similar to those of the first to third embodiments. Specifically, a thin film 23Z is formed so as to cover the inorganic mask pattern 22Z and the substrate 20 exposed by removing the photoresist pattern 21A as shown in FIG. 38. Finally, the inorganic mask pattern 22Z covered with the thin film 23Z is removed by a liftoff process. In this manner, a thin film pattern 23, which has an opening 23E configured corresponding to the inorganic mask pattern 22Z, is completed. Here, all the steps in the method of forming a thin film pattern in the present embodiment are completed.

As mentioned above, the present embodiment includes the steps of forming the photoresist pattern 21A having the opening 21E on the substrate 20, forming the inorganic film 22 so as to cover the upper surface of the photoresist pattern 21A and the inside of the opening 21E by a dry process, removing the inorganic film 22 provided on the photoresist pattern 21A by a dry etching process, forming the inorganic mask pattern 22Z configured corresponding to the opening 21E by removing the photoresist pattern 21A, forming the thin film 23 so as to cover the substrate 20 and the inorganic mask pattern 22Z, and lifting off the inorganic mask pattern 22Z. As a result, a fine thin film pattern having an opening can be formed more easily, with higher resolution and precision.

According to the present embodiment, though the photoresist pattern 21A here has the groove-shaped opening 21E as with the first embodiment, the shape of the opening can be determined arbitrarily. Namely, the photoresist pattern may have a cylindrical opening therein, for example, or the like. In this case, the inorganic mask pattern is configured corresponding to the inner shape of the opening.

In addition, also in the present embodiment as with the second and third embodiments, it is possible to form a mask pattern having a bridge construction or an undercut portion. Even in this case, it is also possible to form a thin film pattern which has an opening configured corresponding to the mask pattern. In this case, the liftoff process becomes easy, formation of burr or the like is prevented, and the fine thin film pattern can be formed more easily with high resolution and precision.

Subsequently, an example of application for the method of forming a mask pattern and the method of forming a thin film pattern according to the first to third embodiments, among the above-mentioned first to fourth embodiments, will be described hereinbelow. The above-mentioned method of forming a mask pattern and method of forming a thin film pattern can be applied to the method of forming a magnetoresistive element (MR element), for example.

EXAMPLE OF APPLICATION

First, configuration of a thin film magnetic head, which is provided with an MR element formed according to the method of forming an MR element will be explained with reference to FIGS. 40 to 42. Here, explanation is made for a tunneling magnetoresistive element (TMR element) as an example of MR elements.

Figure 40:
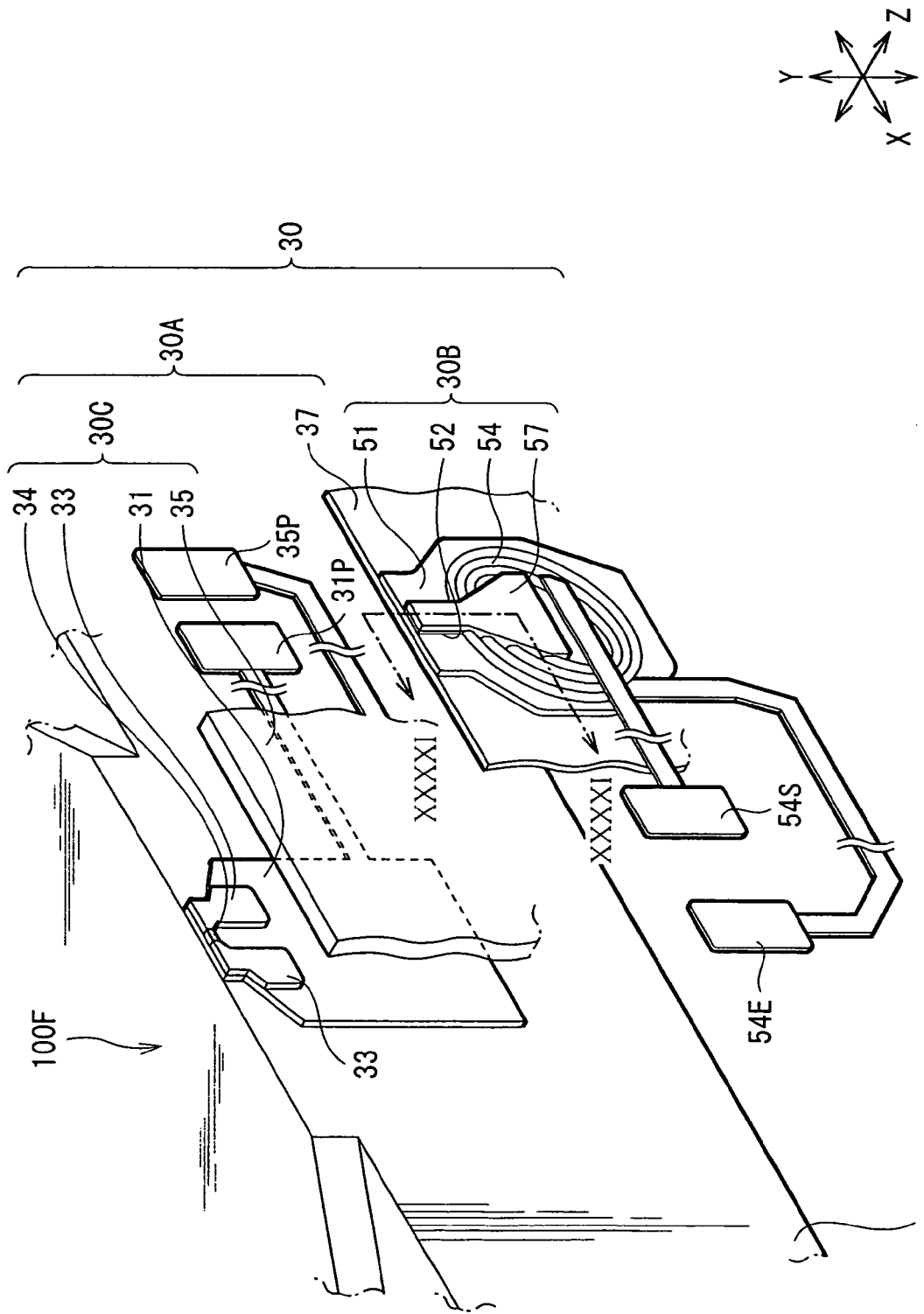
FIG. 40 is an exploded perspective view showing a configuration of a thin film magnetic head including an MR element, which is formed by the method of forming a thin film pattern according to the first to third embodiments of the present invention.

FIG. 40 is an exploded perspective view showing a configuration of a thin film magnetic head 30 formed on one side of a slider in a magnetic head device. FIG. 41 is a sectional view showing a configuration taken along the line XXXXI-XXXXI of FIG. 40, viewed from the direction indicated by the arrows. FIG. 42 is a sectional view as viewed from the direction indicated by the arrows XXXXII of FIG. 41.

Figure 41:
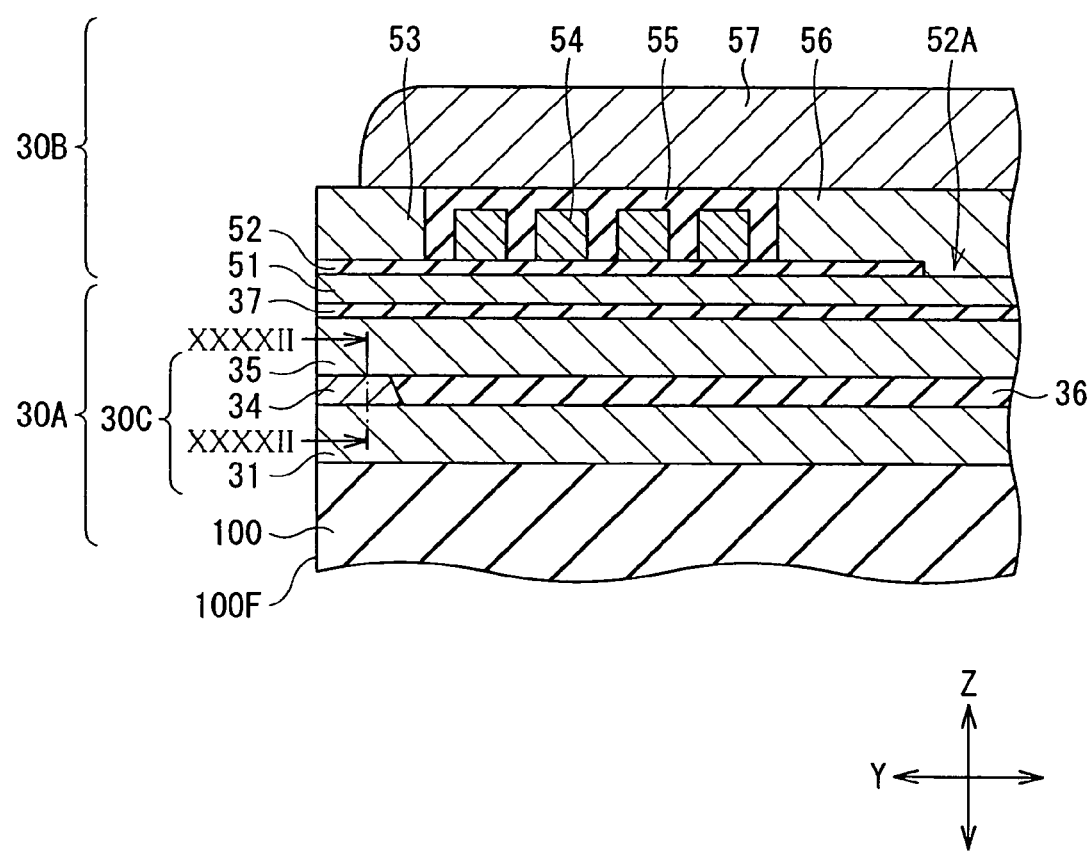
FIG. 41 is a sectional view of the thin film magnetic head shown in FIG. 40 taken along the line XXXXI-XXXXI thereof, as viewed from the direction indicated by arrows.

As shown in FIGS. 40 and 41, the thin film magnetic head 30 is formed by stacking a read head portion 30A and a write head portion 30B in order from a side near a base 100 of the slider. The write head portion 30B writes magnetic information on a write track of a magnetic recording medium, while the read head portion 30A records out the magnetic information written on the magnetic recording medium (not shown).

As shown in FIGS. 40 and 41, the read head portion 30A is configured in such a manner that, on a side exposed to an air bearing surface (hereinafter called ABS) 100F, which is opposed to a recording surface of the magnetic recording medium, a TMR element 30C and an insulating layer 37 are stacked in order on a base 100, for example.

The TMR element 30C is configured in such a manner that a lower electrode 31, a pair of magnetic domain controlling films 33 and a tunneling magnetoresistive film (hereinafter called TMR film) 34, and an upper electrode 35 are stacked in order on the base 100, for example. It is to be noted that, though not illustrated here in FIGS. 40 and 41 but as mentioned later, a pair of insulating layers 32 are provided between the pair of magnetic domain controlling films 33 and the TMR film 34, and between the pair of magnetic domain controlling films 33 and the lower electrode 31. The lower electrode 31 and the upper electrode 35 are made of a magnetic metal material, such as nickel iron alloy (NiFe) respectively, for example. These lower electrode 31 and the upper electrode 35 are opposed to each other with the TMR film 34 in between as viewed in the stacking direction (the direction of Z), so as to prevent the TMR film 34 from influence of unnecessary magnetic fields. The lower electrode 31 is connected to a pad 31P and the upper electrode 35 is connected to a pad 35P so as to further functions as a current path for applying current to the TMR film 34 in the stacking direction (Z-direction). The TMR film 34, which has a spin valve (SV) structure in which many metal oxide films made of a nonmagnetic substance and metal membranes containing a magnetic material are stacked, functions to read the magnetic information written on the magnetic recording medium. The pair of magnetic domain controlling films 33 are arranged in such a manner as to face each other in the width direction of the read track in the magnetic recording medium (X-direction), with the TMR film 34 in between. The insulating layers 36 and 37 are typically made of an electrical insulating material, such as aluminum oxide ($Al_2O_3$) and aluminum nitride (AlN). The insulating layer 36 surrounds the periphery of the TMR film 34 to electrically insulate the lower electrode 31 and the upper electrode 35. The insulating layer 37 is provided to electrically insulate the read head portion 30A and the write head portion 30B.

Figure 42:
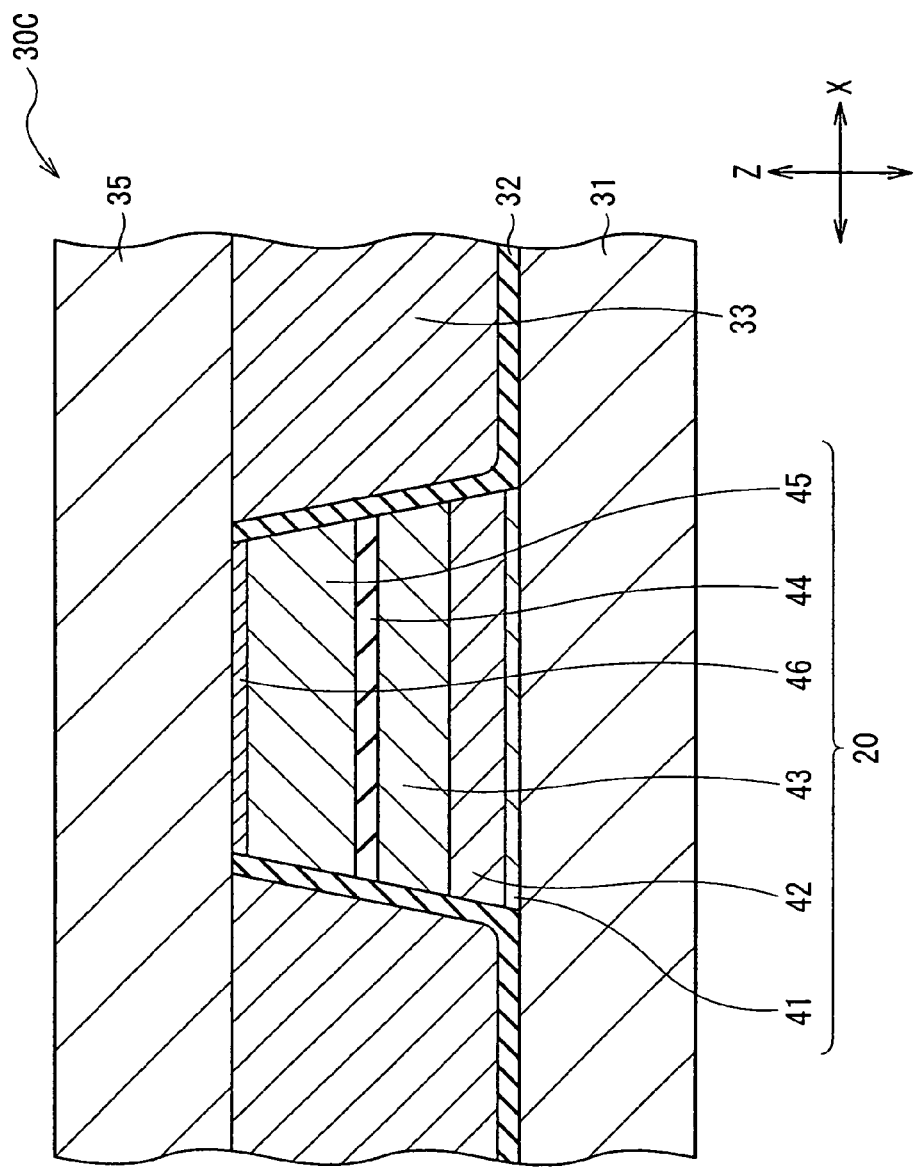
FIG. 42 is a sectional view of the thin film magnetic head of FIG. 40 as viewed from the direction indicated by arrows XXXXII of FIG. 41.

The TMR element 30C includes the TMR film 34 in which a foundation layer 41, an antiferromagnetic layer 42, a fixed magnetization layer 43, an intervening layer 44, a free magnetization layer 45, and a protective layer 46 are stacked in order from the side near the lower electrode 31, as shown in FIG. 42. The TMR element 30C includes an insulating layer 32, which continuously cover from both sides of the TMR film 34 to the upper surface of the lower electrode 31, and the magnetic domain controlling film 33, which is formed via the insulating layer 32 above the lower electrode 31.

The foundation layer (otherwise called buffer layer) 41 has a structure in which a tantalum (Ta) layer and a ruthenium (Ru) layer are stacked, for example, and functions to make smooth an exchange coupling of the antiferromagnetic layer 42 and the fixed magnetization layer 43. The antiferromagnetic layer 42 is typically made of an antiferromagnetic material such as platinum manganese alloy (PtMn) and iridium manganese alloy (IrMn), and functions as what is called a pinning layer for fixing the magnetization direction of the fixed magnetization layer 43. The fixed magnetization layer 43 is constituted including a ferromagnetic material such as cobalt and iron, and functions as what is called a pinned layer of which magnetization direction is fixed by the antiferromagnetic layer 42. The intervening layer 44 is made of an insulating material such as aluminum oxide, and functions as what is called a tunnel barrier layer. The free magnetization layer 45 is made of a ferromagnetic material (soft magnetic material) of low coercive force, and functions as what is called a magnetic free layer of which magnetization direction is varied according to an external magnetic field. The protective layer 46 is typically made of copper, tantalum, ruthenium or the like, and functions to protect the completed TMR element 30C in the course of the manufacturing process.

The insulating layer 32 is typically made of an electrical insulating material such as aluminum oxide or aluminum nitride, thereby electrically insulating the pair of magnetic domain controlling films 33, the TMR film 34 and the lower electrode 31. The magnetic domain controlling film 33 is made of a hard magnetic material typically containing a cobalt platinum alloy (CoPt) or the like, and functions to arrange the magnetic domain directions of the free magnetization layer 45 to a single domain by applying longitudinal bias magnetic field thereto, thereby suppressing generation of Barkhausen noises.

In the read head portion 30A configured in this manner, a magnetization direction of the free magnetization layer 45 of the TMR film 34 changes in accordance with a signal magnetic field applied from the magnetic write medium. Accordingly, there is a relative change in the magnetization direction of the fixed magnetization layer 43 included in the TMR film 34. At that time, when a sense current is applied to the inside of the TMR film 34, the change in the magnetization directions appears as a variation of electric resistance. With this, the signal magnetic field is detected to read magnetic information.

The write head portion 30B is formed on the insulating layer 37 of the read head portion 30A as shown in FIGS. 40 and 41, and includes a lower magnetic pole 51, a write gap layer 52, a pole chip 53, a coil 54, an insulating layer 55, a connection point 56 and an upper magnetic pole 57.

The lower magnetic pole 51 is typically made of a magnetic material such as NiFe, and is formed on the insulating layer 37. The write gap layer 52 is made of an electrical insulating material such as aluminum oxide, and is formed on the lower magnetic pole 51. The write gap layer 52 has an aperture 52A in a portion opposed to the center of the coil 54 as viewed on the X-Y plane, in order to form a magnetic path. On the write gap layer 52, the pole chip 53, the insulating layer 55, and the connection point 56 are formed in the same plane in order from the side near the air bearing surface 100F. The coil 54 is buried in the insulating layer 55. The coil 54 is disposed on the write gap layer 52 so as to be aligned to the center of the opening 52A, and is typically made of copper (Cu) or gold (Au). It is to be noted that both ends of the coil 54 are connected to electrodes 54S and 54E, respectively. The upper magnetic pole 57 is typically made of a magnetic material such as NiFe, and is formed above the write gap layer 52, on the pole chip 53, the insulating layer 55, and the connection point 56. The upper magnetic pole 57 is in contact with the lower magnetic pole 51 via the opening 52A and magnetically connected. Although not illustrated, an overcoat layer which is made of aluminum oxide etc. covers the whole upper surface of the write head portion 30B.

With such configuration, the write head portion 30B produces a magnetic flux in the magnetic path, which is mainly constituted from the lower magnetic pole 51 and the upper magnetic pole 57 when current flows into the coil 54, thereby magnetizing the magnetic recording medium with the signal magnetic field produced around the write gap layer 52, and writing information thereon.

The TMR element 30C included in the above-mentioned thin film magnetic head 30 can be formed according to the method of forming a thin film pattern as mentioned above in the first to third embodiments.

Specifically, first, the lower electrode 31 is formed on one side of the base 100 and it is defined as a substrate 1. Then, a thin film, which is a preliminary stage of the TMR film 34 is formed all over the lower electrode 31 as a thin film 2Z. Next, a mask pattern is formed on the thin film as with the step of forming a mask pattern in the method of forming a thin film pattern according to the first to third embodiments. Next, the pattern of the TMR film 34 is formed as the first thin film pattern, as with the first-half step of patterning according to the first to third embodiments. After this, the second thin film pattern is formed by stacking the pair of insulating layers 32 and the magnetic domain controlling film 33 in order as with the latter-half step of patterning according to the first to third embodiments. In this manner, the insulating layer 32, which is adjoined and in contact with the both sides of the TMR film 34, and the magnetic domain controlling film 33 formed on the insulating layer 32 are disposed.

Operation and effects in the method of forming the TMR element 30C are similar to those in the method of forming a thin film pattern according to the above-mentioned first to third embodiments.

In the above-mentioned example of application, although description is made for the TMR element 30C as an example, the present invention is applicable also to other MR elements, such as a Giant Magnetoresistive (hereinafter called GMR) element, by forming the intervening layer 44 using a nonmagnetic substance such as copper, gold, platinum, or aluminum.

Subsequently, concrete examples for the first to third embodiments, among the above-mentioned first to fourth embodiments, will be described.

Example 1

The inorganic mask pattern 7Z, the thin film pattern 2 and the thin film pattern 8 were formed in such a manner as follows, by the method of forming a thin film pattern according to the first embodiment. Hereafter, detailed description will be made with reference to FIGS. 1 to 10.

First, a silicon substrate (152.4 mm or 6 inches in diameter and 2 mm in thickness) was prepared as the substrate 1. Subsequently, the thin film 2Z made of titanium (Ti) was formed to the thickness of 50 nm on the substrate 1 by a sputtering process. In this case, a bias sputtering apparatus by Hitachi Ltd. was used as a sputtering system, using titanium as the target and argon gas as the sputtering gas.

Next, "Sumitomo Chemical PEK-505" was applied over the whole surface of the thin film 2Z by a spin coat method, then heated at 100° C. for 60 seconds, thereby the photoresist layer 3 of 0.2 μm in thickness was obtained as shown in FIG. 1.

Next, as shown in FIG. 2, the photoresist layer 3 was selectively exposed via the photo mask 4 to form the latent image portion 5. Here, exposure was made on an exposure device "Canon FPA5000ES4". Exposure conditions were determined as follows for obtaining the best focus: wavelength (λ), 248 nm; numerical aperture (NA), 0.8; opening (σ) (ratio of NA in the illumination system to NA of lens), 0.8; light exposure (dose) setting, 30 mJ/cm$^2$. After exposing, heat-treatment was applied in a 110° C. atmosphere for 360 seconds, then, the latent image portion 5 was developed in 2.38% tetramethylammonium hydroxide (TMAH) solution for 60 seconds, and washed and dried. In this manner, the photoresist pattern 3A having the groove-shaped opening 3E was formed as shown in FIG. 3. The width W1 of the opening 3E was 120 nm.

Subsequently, as shown in FIG. 4, the process of narrowing the inside dimension was applied. In this case, "Safire resin FSC" by TOKYO OHKA KOGYO CO., LTD. was applied by a spin coat method, and heated at 130° C. for 180 seconds, thereby the water-soluble resin layer 6 of 0.2 μm in thickness was obtained. After this, the water-soluble resin layer 6 was removed by washing, and dried. Here, the series of narrowing steps shown in FIG. 4 were repeated four times in total. As a result, the width W2 of the opening 3E was finally reduced to 60 nm as shown in FIGS. 4E and 4F.

Subsequently, as shown in FIGS. 5A and 5B, the inorganic film 7 made of alumina was formed to the thickness of 35 nm by low-temperature CVD process so as to cover the upper surface of the photoresist pattern 3A and fill the inside of the opening 3E. In this case, "ASM PULSAR" by ASM International was used as a CVD system, using trimethylamine (TMA) and water as the material gas. Substrate temperature was kept at 200° C.

Subsequently, as shown in FIG. 6, the inorganic film 7 on the photoresist pattern 3A was removed by a milling process. In this case, "Hitachi MLV" was used as a milling device. Milling conditions were determined as follows: milling gas, argon; milling current, 300 mA; and milling angle was set to 60° with respect to the altitude of the substrate surface.

Subsequently, as shown in FIG. 7, the photoresist pattern 3A was dissolved and removed by being immersed in 2-methyl pyrrolidone (NMP) and shaken. In this case, the shaking direction was in parallel with the length direction of the groove-shaped opening 3E. The isolated line-shaped inorganic mask pattern 7Z was thus completed. This inorganic mask pattern 7Z had a microscopic undercut portion at the bottom thereof due to a standing wave of the photoresist pattern 3A.

Next, as shown in FIG. 8, the thin film 2Z was selectively etched by a milling process using the inorganic mask pattern 7Z as a mask, thereby the thin film pattern 2 configured corresponding to the inorganic mask pattern 7Z was obtained as the first isolated line-shaped thin film pattern. In this case, "Hitachi MLV" was used as a milling device. Milling conditions were determined as follows: milling gas, argon; milling current, 300 mA; and milling angle was set to 45° with respect to the altitude of the substrate surface.

After this, as shown in FIG. 9, the thin film 8Z made of tantalum (Ta) was formed to the thickness of 50 nm by a sputtering process so as to cover the substrate 1 exposed by etching and the inorganic mask pattern 7Z. In this case, the bias sputtering apparatus by Hitachi Ltd. was used as sputtering system, using tantalum as the target and argon gas as the sputtering gas.

Finally, the inorganic mask pattern 7Z covered with the thin film 8Z was removed by a liftoff process. In the liftoff process, the inorganic mask pattern 7Z covered with the thin film 8Z was removed by being immersed in 2.38% TMAH solution, which is an alkaline aqueous solution, and shaken in a direction parallel to the length direction of the isolated line-shaped first thin film. As a result, the isolated line-shaped thin film pattern 2 made of titanium (50 nm in thickness and 60 nm in width), and the thin film pattern 8 or the second thin film pattern made of tantalum (50 nm thick), which was disposed in contact with the both sides, as viewed in the width direction, of the thin film pattern 2, were completed as shown in FIG. 10.

Example 2

The mask pattern 11Z, the thin film pattern 2A and the thin film pattern 8A were formed in such a manner as follows, by the method of forming a thin film pattern according to the second embodiment. Detailed description will be made hereinbelow with reference to FIGS. 11 to 20.

First, the thin film 2Z made of titanium was formed to the thickness of 50 nm on a silicon substrate (152.4 mm in diameter and 2 mm in thickness) by sputtering process in a manner similar to Example 1. Next, "Sumitomo Chemical PEK-505" was applied over the whole surface of the thin film 2Z by a spin coat method, then heated at 100° C. for 60 seconds, the photoresist layer 9 of 0.2 μm in thickness was obtained.

Next, the photoresist layer 9 was exposed selectively as shown in FIG. 11B via the photo mask 4A as shown in FIG. 11A, thereby forming the latent image portion 5A. The exposure device, the exposure condition, and the processing procedure were the same as Example 1. In this manner, the photoresist pattern 9A which had the groove-shaped opening 9E1 and the openings 9E2, which was connected to both ends of the opening 9E1 and whose width was larger than that of the opening 9E1, was completed as shown in FIG. 12. The width W1 of the opening 9E1 was 120 nm.

Subsequently, inside dimensions of the openings 9E1 and 9E2 were narrowed. In this case, the narrowing procedure was the same as that of Example 1 except that the series of narrowing steps shown in FIG. 4 were repeated three times in total. In this manner, the width W2 of the opening 9E1 was reduced to 75 nm.

Subsequently, as shown in FIG. 13, the inorganic layer 10 or the first inorganic layer made of alumina was formed to the thickness of 15 nm by low-temperature CVD process so as to cover the upper surface of the photoresist pattern 9A and the inside of the openings 9E1 and 9E2. In this case, "ASM PULSAR" by ASM International was used as a CVD system, using TMA and cold water as the material gas. Substrate temperature was set to 200° C. Then, the inorganic layer 11 or the second inorganic layer made of tantalum was stacked to the thickness of 50 nm by PCM sputtering process on the inorganic layer 10 as shown in FIG. 14. In this case, "Anelva COSMOS" was used as a sputtering system, using tantalum as target and argon as the sputtering gas. Here, the RF frequency was set to 60 MHz as a sputtering condition.

Subsequently, as shown in FIG. 15, the inorganic layer 10 and the inorganic layer 11 on the photoresist pattern 9A were removed by a milling process. In this case, "Hitachi MLV" was used as a milling device. The milling conditions were determined as follows: milling gas, argon; milling current, 300 mA; and milling angle was set to 60° with respect to the altitude of the substrate surface.

Subsequently, as shown in FIG. 16, the photoresist pattern 9A was dissolved and removed by being immersed in NMP and shaken, thereby the inorganic mask pattern 11Y was obtained. In this case, the shaking direction was in parallel with the length direction of the groove-shaped opening 9E1. After this, as shown in FIG. 17, the area 10A, which is included in the inorganic layer 10 constituting the inorganic mask pattern 11Y, was dissolved and removed by being immersed in 2.38% TMAH solution and shaken, thereby the mask pattern 11Z having a bridge construction was obtained.

Next, as shown in FIG. 18, the thin film 2Z was selectively etched by a milling process using the mask pattern 11Z as a mask, thereby the isolated thin film pattern 2A configured similarly to the mask pattern 11Z was obtained. In this case, "Hitachi MLV" was used as a milling device. The milling conditions were determined as follows: milling gas, argon; milling current, 300 mA; and milling angle was set to zero degrees with respect to the altitude of the substrate surface.

After this, the thin film 8Z made of tantalum (Ta) was formed to the thickness of 50 nm by a sputtering process so as to cover the mask pattern 11Z and the substrate 1 exposed by etching, as shown in FIG. 19. In this case, a bias sputtering apparatus by Hitachi Ltd. was used as sputtering system, using tantalum as the target and argon gas as the sputtering gas.

Finally, the mask pattern 11Z covered with the thin film 8Z was removed by a liftoff process. In the liftoff process, the mask pattern 11Z covered with the thin film 8Z was removed by being immersed in 2.38% TMAH solution, which is an alkaline aqueous solution, and shaken in a direction parallel to the length direction of the isolated line-shaped thin film pattern 2A. As a result, the thin film pattern 2A including an isolated line-shaped portion which is made of titanium (50 nm in thickness and 45 nm in width), and the thin film pattern 8A (50 nm thick), which is made of tantalum and disposed in contact with the both sides, as viewed in the width direction, of the thin film pattern 2A, with the thin film pattern 2A in between, were completed as shown in FIG. 20.

Example 3

The mask pattern 14Z, the thin film pattern 2, and the thin film pattern 8 were formed in such a manner as follows, by the method of forming a thin film pattern according to the third embodiment. Detailed description will be made hereinbelow with reference to FIGS. 22 to 31.

First, the thin film 2Z made of titanium (Ti) was formed to the thickness of 50 nm on the substrate 1 made of silicon (152.4 mm in diameter, 2 mm in thickness) by a sputtering process, in a manner similar to Example 1. Next, the poly methyl glutar imide (by MCC; LOR) was applied so as to cover the whole surface of the thin film 2Z by a spin coat method, then heat-treatment was applied thereto at 170° C. for 180 seconds, thereby the soluble layer 12 of 20 nm in thickness was obtained. Next, "Sumitomo Chemical PEK-505" was applied over the whole surface of the soluble layer 12 by a spin coat method, then heated at 100° C. for 60 seconds, thereby the photoresist layer 13 of 0.2 μm in thickness was obtained as shown in FIG. 22.

Next, the photoresist layer 13 was exposed selectively via the photo mask 4 as shown in FIG. 23, thereby forming the latent image portion 5. In this case, the exposure device, the exposure condition, and the processing procedure were the same as Example 1 except that the time of the processing procedure was set to 30 seconds. In this manner, the photoresist pattern 13A which has the groove-shaped opening 13E was formed as shown in FIG. 24. The width W1 of the opening 13E was 120 nm. Subsequently, the inside dimension of the opening 13E was narrowed as with Example 1. As a result, the width W2 of the opening 13E was reduced to 60 nm.

Subsequently, an inorganic layer made of alumina (15 nm thick) and an inorganic layer made of tantalum (50 nm thick) were stacked in order so as to cover the upper surface of the photoresist pattern 13A and the inside of the opening 13E, thereby the inorganic film 14 (65 nm thick in total) was formed, as shown in FIG. 25. In this case, first, the inorganic layer made of alumina was formed to the thickness of 15 nm by low-temperature CVD process (CVD system, "ASM PULSAR" by ASM International; material gas, TMA and cold water; and substrate temperature, 200° C.). Then, the inorganic layer made of tantalum was stacked thereon to the thickness of 50 nm by PCM sputtering process (sputtering system, "Anelva COSMOS"; target, tantalum; sputtering gas, argon; and RF frequency, 60 MHz).

Subsequently, as shown in FIG. 26, the inorganic film 14 on the photoresist pattern 13A was removed by a milling process. In this case, "Hitachi MLV" was used as a milling device. The milling conditions were determined as follows: milling gas, argon; milling current, 300 mA; and milling angle was set to 60° with respect to the altitude of the substrate surface.

Subsequently, as shown in FIG. 27, the photoresist pattern 13A was dissolved and removed by being immersed in ethyl lactate and shaken, thereby the inorganic mask pattern 14Y was formed. In this case, the shaking direction was in parallel with the length direction of the groove-shaped opening 13E. After this, as shown in FIG. 28, the soluble layer 12 was partially dissolved and removed by being immersed in 1.59% TMAH solution and shaken, thereby the undercut structure 12C was formed. As a result, the mask pattern 14Z having the undercut structure 12C was completed.

Next, the thin film 2Z was selectively etched by a milling process using the mask pattern 14Z as a mask, thereby the isolated line-shaped thin film pattern 2 configured similarly to the mask pattern 14Z was formed, as shown in FIG. 29. In this case, "Hitachi MLV" was used as a milling device, and the milling conditions were determined as follows: milling gas, argon; milling current, 300 mA; and milling angle was set to 45° with respect to the altitude of the substrate surface.

After this, the thin film 8Z made of tantalum was formed to the thickness of 50 nm by a sputtering process so as to cover the substrate exposed by etching and the mask pattern 14Z, as shown in FIG. 30. In this case, the bias sputtering apparatus by Hitachi Ltd. was used as a sputtering system, using tantalum as the target and argon gas as the sputtering gas.

Finally, the mask pattern 14Z covered with the thin film 8Z was removed by a liftoff process. In the liftoff process, the mask pattern 14Z covered with the thin film 8Z was removed by being immersed in NMP and shaken in a direction parallel to the length direction of the isolated line-shaped thin film pattern 2. As a result, the isolated line-shaped thin film pattern 2 (50 nm in thickness and 45 nm in width) made of titanium, and the thin film pattern 8 (50 nm thick), which was made of tantalum and disposed in contact with both-ends, as viewed in the width direction, of the thin film pattern 2, with the thin film pattern 2 in between, as shown in FIG. 31.

Comparative Example 1

As a comparative example corresponding to the above-mentioned examples, a mask pattern 114Z was formed according to the steps shown in FIGS. 43 to 47. Detailed description will be made hereinafter.

First, a thin film 111 made of titanium was formed to the thickness of 50 nm by a sputtering process on a silicon substrate 110 (152.4 mm in diameter and 2 mm in thickness). In this case, the sputtering conditions were the same as Example 1. Next, "Sumitomo Chemical PEK-505" was applied over the whole surface of the thin film 111 by a spin coat method, then heated at 100° C. for 60 seconds, thereby a photoresist layer 112 of 0.2 µm in thickness was obtained.

Figure 43:
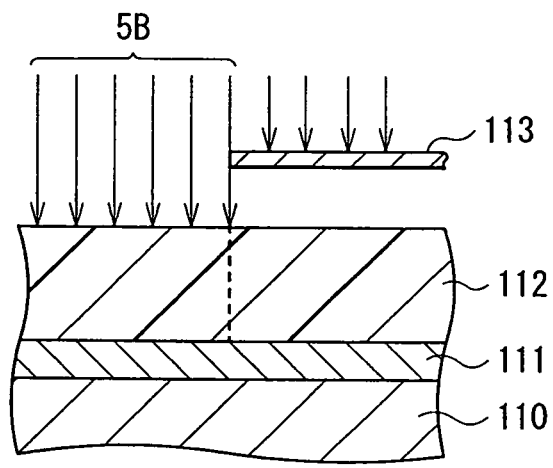
FIG. 43 is a sectional view of a step in the method of forming a mask pattern according to a comparative example.
Figure 44:
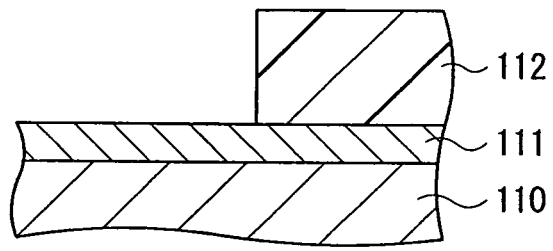
FIG. 44 is a sectional view of a step subsequent to FIG. 43.

Next, the photoresist layer 112 was exposed selectively via a photo mask 113 as shown in FIG. 43, thereby a latent image portion 5B was formed. In this case, exposure conditions etc. were the same as those of Example 1. In this manner, a photoresist pattern 112A with a rectangular section, 0.2 µm thick×5 µm long×5 µm wide, was formed as shown in FIG. 44.

Figure 45:
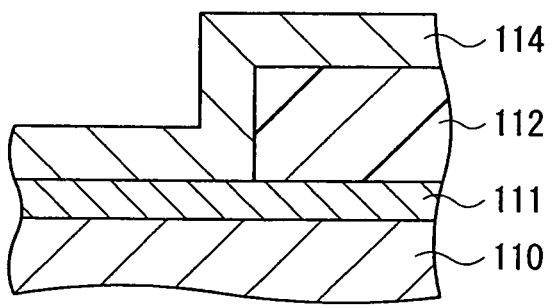
FIG. 45 is a sectional view of a step subsequent to FIG. 44.

Subsequently, an inorganic film 114 made of alumina was formed to the thickness of 60 nm by low-temperature CVD process so as to cover the upper surface and the side face of the photoresist pattern 112A and an exposed portion of the thin film 111 as shown in FIG. 45. In this case, "ASM PULSAR" by ASM International was used as a CVD system, using TMA and cold water as the material gas. Substrate temperature was set to 200° C.

Figure 46:
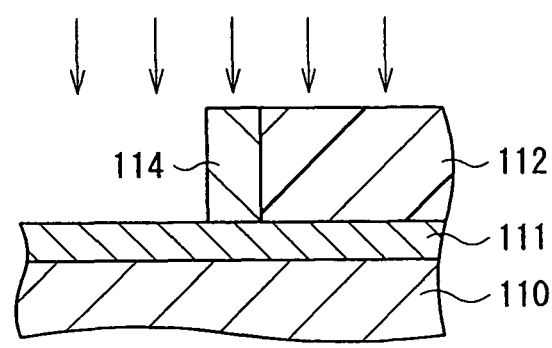
FIG. 46 is a sectional view of a step subsequent to FIG. 45.

Subsequently, as shown in FIG. 46, the inorganic film 114 on the photoresist pattern 112A was removed by a milling process. At the same time, the inorganic film 114 on the thin film 111, which was formed to the same thickness as that on the photoresist pattern 112A, was also removed by a milling process. In this case, "Hitachi MLV" was used as a milling device. The milling conditions were determined as follows: milling gas, argon; milling current, 300 mA; and milling angle was set to zero degrees with respect to the altitude of the substrate surface.

Figure 47:
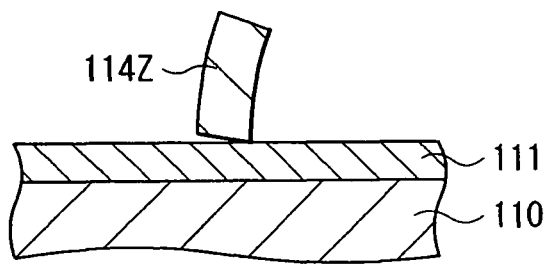
FIG. 47 is a sectional view of a step subsequent to FIG. 46.

Subsequently, the photoresist pattern 112A was dissolved and removed by being immersed in NMP and shaken. As a result, the inorganic film 114, which is an isolated line-shaped pattern, was inclined with respect to the substrates surface and it was distorted entirely, as shown in FIG. 47. In this case, it seemed to fall in the direction where the photoresist pattern 112A had existed, thereby we could not proceed to the subsequent process of etching the thin film 111.

As mentioned above, it has been found that, in Examples 1 to 3, it was possible to form isolated line-shaped mask patterns without deformation such as distortion and physical displacement such as inclination, thereby making it possible to form thin film patterns of microscopic dimension with high precision using the mask patterns. On the other hand, in the comparative example 1, the inorganic film was inclined with respect to the substrate surface and entirely distorted, thereby a mask pattern was not available, as described above. It has been thus confirmed that the method of forming a mask pattern and a thin film pattern according to the present invention makes it possible to form a fine thin film pattern more easily with higher resolution and high precision. Accordingly, it has been confirmed that MR elements having a fine thin film pattern may be formed more easily with higher resolution and precision by use of the present method of forming a mask pattern and a thin film pattern.

As mentioned above, some embodiments and examples were given to describe the present invention, but it is to be noted that the present invention is not limited to the above-described embodiments or examples, and can be modified in various ways. For example, in the above-mentioned embodiments and examples, although a photoresist pattern including a groove-shaped opening configured like a groove is formed so that an isolated line-shaped inorganic mask pattern configured corresponding to the opening is formed, it is also possible to form a photoresist pattern having another shape of opening so as to form an inorganic mask pattern configured corresponding to that opening. Examples of the opening shape includes a round shape and a polygon. Also in this case, it is possible to form a thin film pattern configured corresponding to the mask pattern by use of it. In the above-mentioned embodiments and examples, although the groove-shaped configuration is that the width is smaller than the length as viewed in the plan view and rectangular as viewed in the cross-sectional configuration, it is not limited to this. For example, the groove-shaped configuration may be curved as viewed in the plan view, or it may not be constant in width. The cross sectional configuration thereof may be trapezoidal, or it may include a curved outline.

In the above-mentioned embodiments and examples, an inorganic film is formed to cover the upper surface of the photoresist pattern, exposed portion of the substrate and wall surface of the photoresist pattern within the opening. However, effects of the present invention are available if only the inorganic film is formed to cover at least the exposed portion of the substrate within the opening. Moreover, in the above-mentioned embodiments and examples, although the inorganic film is formed to have a single layer or two-layer structure, one or more layers may be further stacked to become a multilayer. For example, after forming an inorganic film by a dry process, another inorganic film such as a plating film may be stacked thereon by wet processes, or an organic layer typically made of a photoresist material may be stacked.

In addition, in the above-mentioned embodiments and examples, although a positive photoresist is used in formation of the photoresist layer, a negative photoresist may be used.

Further, in the above-mentioned embodiments, although the TMR element was mentioned as an example of MR elements, it is not limited to this. For example, it may be other bottom spin valve MR elements and topspin valve MR elements.

The method of forming a mask pattern according to the present invention can be suitably applied not only to the formation of MR elements included in a thin film magnetic head but also to various kinds of thin film patterns included in other electronic and magnetic devices such as a semiconductor device. For example, it is applicable to the formation of a wiring pattern in a micromachine and to the patterning of a thin film magnetic memory device included in MRAM (magnetoresistive random access memory), and so on.

The reference numerals used in FIGS. 1 to 42 are as follows
1, 20: substrate,
2, 2A, 8, 8A: thin film pattern,
2Z, 8Z: thin film,
3, 9, 13, 21: photoresist layer,
3A, 9A, 13A, 21A: photoresist pattern,
3E, 9E1, 9E2, 13E, 21E, 23E: opening,
5, 5A: latent image portion,
4, 4A: photo mask,
6: water-soluble resin layer,
7, 14, 22: inorganic film,
10, 11: inorganic layer,
7Z, 11Y, 11Y1, 14Y, 14Y1, 22Z: inorganic mask pattern,
11Z, 11Z1, 14Z, 14Z1: mask pattern,
10C: undercut portion,
10E, 12E: gap,
12, 12Z: soluble layer,
12C: undercut structure,
30A: read head portion,
30B: write head portion,
30C: tunneling magnetoresistive (TMR) element,
31: lower electrode,
31P, 34P: pad,
32: insulating layer,
33: magnetic domain controlling film,
34: TMR film,
35: upper electrode,
36, 37, 55: insulating layer,
41: foundation layer,
42: antiferromagnetic layer,
43: fixed magnetization layer,
44: intervening layer,
45: free magnetization layer,
46: protective layer,
51: Lower magnetic pole,
52: write gap layer,
53: pole chip,
54: coil,
54E, 54S: electrode,
56: connection point,
57: upper magnetic pole,
100: substrate,
100F: air bearing surface

The invention claimed is:

1. A method of forming a mask pattern comprising steps of:
forming, on a substrate, a photoresist pattern having an opening,
forming an inorganic film by a dry process so as to cover upper surface of the photoresist pattern and, without filling the opening completely, cover an inside surface of the opening,
removing the inorganic film on the upper surface of the photoresist pattern by a dry etching process, and
removing the photoresist pattern, thereby forming a U-shaped inorganic mask pattern corresponding to the opening.

2. The method of forming a mask pattern according to claim 1, wherein
the photoresist pattern is formed so that the opening may include a groove-shaped opening and a pair of other openings connected to both ends of the groove-shaped opening, respectively,
the inorganic film is formed by stacking a first inorganic layer and a second inorganic layer in order, and
at least both ends, in the width direction, of a portion of the first inorganic layer included in the inorganic mask pattern are dissolved and removed, the portion having a shape corresponding to the groove-shaped opening.

3. The method of forming a mask pattern according to claim 2, wherein, the portion of the first inorganic layer corresponding to the groove-shaped opening is entirely dissolved and removed.

4. The method of forming a mask pattern according to claim 1, wherein
the inorganic film is formed by stacking a first inorganic layer and a second inorganic layer in order, and
an outer edge of the first inorganic layer included in the inorganic mask pattern is partially dissolved and removed so that an undercut structure is formed in the inorganic mask pattern.

5. The method of forming a mask pattern according to claim 4, wherein
the inorganic mask pattern is long and slender in shape, and,
both ends, at least in a width direction, of the first inorganic layer included in the inorganic mask pattern are dissolved and removed.

6. The method of forming a mask pattern according to claim 1, wherein
the substrate is formed so as to include a soluble layer as its uppermost layer,
the photoresist pattern is formed on the soluble layer so that the opening include a groove-shaped opening and a pair of other openings connected to both ends of the groove-shaped opening, respectively, and
at least both-ends, in a width direction, of a portion of the soluble layer just beneath the inorganic mask pattern are dissolved and removed, the portion having a shape corresponding to the groove-shaped opening.

7. A method of forming a mask pattern comprising steps of:
forming, on a substrate, a photoresist pattern having an opening,
forming an inorganic film by a dry process so as to cover upper surface of the photoresist pattern and, without filling the opening completely, cover an inside surface of the opening,
removing the inorganic film on the upper surface of the photoresist pattern by a dry etching process, and
removing the photoresist pattern, thereby forming an inorganic mask pattern corresponding to the opening, wherein
the substrate is formed so as to include a soluble layer as its uppermost layer,
the photoresist pattern is formed on the soluble layer so that the opening include a groove-shaped opening and a pair of other openings connected to both ends of the groove-shaped opening, respectively,
at least both-ends, in a width direction, of a portion of the soluble layer just beneath the inorganic mask pattern are dissolved and removed, the portion having a shape corresponding to the groove-shaped opening, and
the soluble layer in the region just beneath the portion of the inorganic mask pattern is entirely dissolved and removed.

8. A method of forming a mask pattern comprising steps of:
forming, on a substrate, a photoresist pattern having an opening,
forming an inorganic film by a dry process so as to cover upper surface of the photoresist pattern and, without filling the opening completely, cover an inside surface of the opening,
removing the inorganic film on the upper surface of the photoresist pattern by a dry etching process, and
removing the photoresist pattern, thereby forming an inorganic mask pattern corresponding to the opening, wherein
the substrate is formed so as to include a soluble layer as its uppermost layer,
the photoresist pattern is formed on the soluble layer, and
an outer edge of the soluble layer just beneath the inorganic mask pattern is partially dissolved and removed, thereby an undercut structure is formed.

9. The method of forming a mask pattern according to claim 8, wherein the inorganic mask pattern is long and slender in shape, and at least both ends, in a width direction, of the soluble layer just beneath the inorganic mask pattern are dissolved and removed.

10. The method of forming a mask pattern according to claim 1, wherein the inorganic film is formed after an inside dimension of the opening is narrowed.

11. The method of forming the mask pattern according to claim 1, wherein the inorganic film on the upper surface of the photoresist pattern is over-etched and removed by the dry etching process.

12. The method of forming a mask pattern according to claim 1, wherein the inorganic film is formed so as to fill the opening.

13. A method of forming a thin film pattern comprising steps of:
forming, on a first thin film to be processed, a photoresist pattern having an opening,
forming an inorganic film so as to cover upper surface of the photoresist pattern and, without filling the opening completely, cover an inside surface of the opening by a dry process,
removing the inorganic film on the upper surface of the photoresist pattern by a dry etching process,
removing the photoresist pattern, thereby forming a U-shaped inorganic mask pattern corresponding to the opening, and
forming a first thin film pattern through patterning the thin film to be processed by selectively removing the first thin film to be processed using the inorganic mask pattern.

14. The method of forming a thin film pattern according to claim 13, further comprising steps of:
forming a second thin film so as to cover the inorganic mask pattern and an exposed region where the first thin film to be processed is removed, and
forming a second thin film pattern on both sides of the first thin film pattern by lifting off the inorganic mask pattern covered with the second thin film.

15. A method of forming a thin film pattern, comprising steps of:
forming, on a substrate, a photoresist pattern having an opening,
forming an inorganic film by a dry process so as to cover upper surface of the photoresist pattern and, without filling the opening completely, cover an inside surface of the opening,
removing the inorganic film on the upper surface of the photoresist pattern by a dry etching process,
removing the photoresist pattern, thereby forming a U-shaped inorganic mask pattern corresponding to the opening,
forming a thin film so as to cover the inorganic mask pattern and an exposed region where the photoresist pattern is removed, and
lifting off the inorganic mask pattern covered with the thin film.

16. A method of forming a magnetoresistive element, comprising steps of:
forming a photoresist pattern having an opening on a magnetoresistive film,
forming an inorganic film by a dry process so as to cover upper surface of the photoresist pattern and, without filling the opening completely, cover an inside surface of the opening,
removing the inorganic film on the upper surface of the photoresist pattern by a dry etching process,
removing the photoresist pattern, thereby forming a U-shaped inorganic mask pattern corresponding to the opening, and
selectively removing the magnetoresistive film using the inorganic mask pattern, thereby forming a magnetoresistive film pattern.

17. The method of forming a magnetoresistive element according to claim 16, further comprising steps of:
forming a thin film including a magnetic bias layer so as to cover the inorganic mask pattern and a region where the magnetoresistive film is removed,
forming, on both sides of the magnetoresistive film pattern, a pair of thin film patterns including the magnetic bias layer by lifting off the inorganic mask pattern covered with the thin film.

18. The method of forming a magnetoresistive element according to claim 17, wherein the step of forming the thin film includes steps of forming an insulating layer and then forming the magnetic bias layer on the insulating layer.

19. A method of forming a mask pattern comprising steps of:
forming, on a substrate, a photoresist pattern having an opening,
forming an inorganic film by a dry process so as to cover upper surface of the photoresist pattern and inside of the opening,
removing the inorganic film on the upper surface of the photoresist pattern by a dry etching process, and
removing the photoresist pattern, thereby forming a U-shaped inorganic mask pattern corresponding to the opening, wherein
the inorganic film on the upper surface of the photoresist pattern is over etched.

* * * * *